(12) United States Patent
Chang et al.

(10) Patent No.: US 12,087,558 B2
(45) Date of Patent: Sep. 10, 2024

(54) ION BEAM ETCHING APPARATUS AND METHOD

(71) Applicant: Taiwan Semiconductor Manufacturing Co., Ltd., Hsinchu (TW)

(72) Inventors: Jung-Hao Chang, Taichung (TW); Po-Chin Chang, Taichung (TW); Pinyen Lin, Rochester, NY (US); Li-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 418 days.

(21) Appl. No.: 17/402,030

(22) Filed: Aug. 13, 2021

(65) Prior Publication Data
US 2023/0050650 A1  Feb. 16, 2023

(51) Int. Cl.
*H01J 37/32* (2006.01)
*H01L 21/263* (2006.01)
*H01L 21/687* (2006.01)

(52) U.S. Cl.
CPC .. *H01J 37/32651* (2013.01); *H01J 37/32422* (2013.01); *H01J 37/32733* (2013.01); *H01L 21/2633* (2013.01); *H01L 21/68764* (2013.01); *H01J 2237/334* (2013.01)

(58) Field of Classification Search
CPC ........... H01J 37/32651; H01J 37/32422; H01J 37/32733; H01J 37/08; H01J 37/32633; H01J 2237/334; H01L 21/2633; H01L 21/68764; H01L 21/67167; H01L 21/67213; H01L 21/67069
USPC ...................................... 250/492.3
See application file for complete search history.

(56) References Cited

U.S. PATENT DOCUMENTS

| | | | | |
|---|---|---|---|---|
| 2006/0284110 A1* | 12/2006 | Nishimura | ............. | B82Y 10/00 250/491.1 |
| 2008/0149856 A1* | 6/2008 | Low | ........................ | H01J 37/09 438/510 |
| 2010/0308236 A1* | 12/2010 | Carlson | ............... | H01J 37/3171 250/492.3 |
| 2013/0130484 A1* | 5/2013 | Wan | ........................ | C23C 14/04 438/514 |
| 2016/0196951 A1* | 7/2016 | Ohsawa | ............... | H01J 37/3053 250/492.3 |
| 2023/0031722 A1* | 2/2023 | Yang | .................. | H01L 21/31116 |

* cited by examiner

*Primary Examiner* — Jason L McCormack
(74) *Attorney, Agent, or Firm* — Sterne, Kessler, Goldstein & Fox P.L.L.C.

(57) ABSTRACT

The present disclosure relates to a semiconductor device manufacturing system. The semiconductor device manufacturing system can include a chamber and an ion source in the chamber. The ion source can include an outlet. The ion source can be configured to generate a particle beam. The semiconductor device manufacturing system can further include a grid structure proximate to the outlet of the ion source and configured to manipulate the particle beam. A first portion of the grid structure can be electrically insulated from a second portion of the grid structure.

20 Claims, 22 Drawing Sheets

ION BEAM ETCHING APPARATUS AND METHOD

BACKGROUND

Advances in semiconductor technology have increased the demand for semiconductor devices with higher device density. To meet these demands, the semiconductor industry continues to scale down separations between semiconductor device patterns. Such scaling down may go beyond the capability of the lithography apparatus. To achieve the desired semiconductor device pattern density and topography, an additional lateral etching process, such as an elongation process, can be performed on semiconductor wafers by an etching apparatus.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
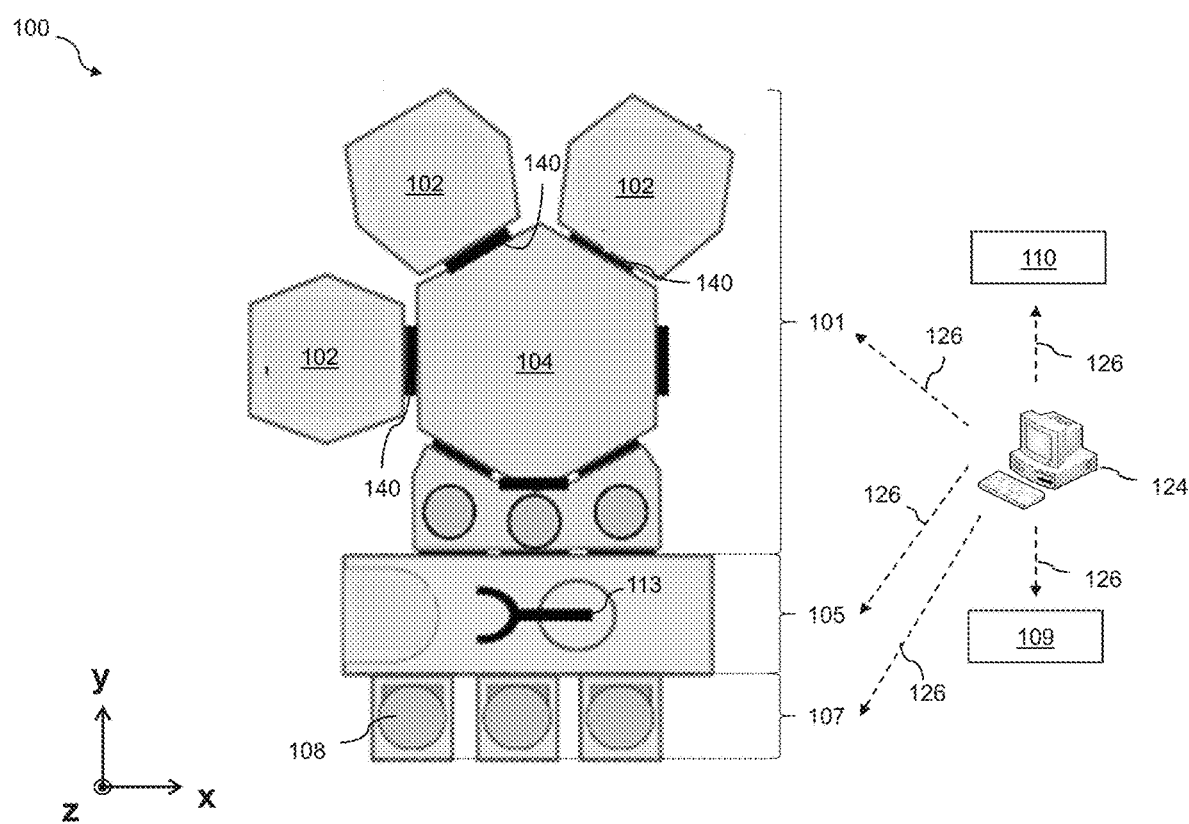
FIG. 1 illustrates a plan view of a semiconductor device manufacturing system, according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to a surface, such as a substrate's surface, an outlet's surface, and a stage's surface.

Technology advances in the semiconductor industry drive the pursuit of integrated circuits (ICs) having higher device density. In the course of the IC evolution, various lithography technologies, such as deep ultraviolet (DUV) lithography and extreme ultraviolet (EUV) lithography, have been adopted to achieve ICs with higher device densities. To go beyond the lithography technologies' limits, a lateral etching process (e.g., an elongation process) can be adopted to further increase device densities (e.g., reduce separations between semiconductor device patterns). The elongation process can be performed by an etching apparatus, such as an ion beam etching (IBE) apparatus. During the elongation process, the etching apparatus provides an ion beam and/or a plasma at a tilted angle, with respect to semiconductor substrate's normal, to laterally etch semiconductor substrate's device patterns. The laterally etched semiconductor substrate's device patterns can be extended towards the adjacent device patterns, thus reducing a separation in between. However, because the ion beam and/or the plasma striking at the tilted angle may not provide a uniform irradiation across the semiconductor substrate's surface, the elongation process may cause non-uniform lateral etching rates across the semiconductor substrate, thus reducing the yield and reliability of the ICs.

The present disclosure provides an apparatus and methods for performing an elongation process with an improved etching uniformity across a substrate. The elongation process can be performed by a dry etching apparatus, such as an ion beam etching (IBE) apparatus and a reactive ion etching (RIE) apparatus. The dry etching apparatus can include an ion source configured to generate particle beams (e.g., plasmas and/or ion beams), a chuck configured to hold a substrate, and a shutter configured to control a pass-through of the particle beams to irradiate the substrate. During the elongation process, the chuck can slant the substrate to receive the particle beams. Accordingly, a first portion of the tilted substrate can be far from the ion source, and a second portion of the tilted substrate can be close to the ion source. Since the particle beams' energy can decay as the particle beams' travel distance increase, the irradiance (e.g., Watt/$m^2$) received by the first portion of the substrate that is far from the ion source can be less than that received by a second portion of the substrate that is close to the ion source. To reconcile the irradiance's discrepancy between the first and second portions of the substrate, the shutter can be configured to horizontally move from the first portion of the substrate to the second portion of the substrate during the elongation process (e.g., the shutter can move along a direction from a horizontal projected spot of the first portion of the substrate to another horizontal project spot of the second portion of the substrate). Accordingly, the first portion of the substrate can expose to the ion source longer than the second portion of the substrate, thus equalizing the radiant exposure (e.g., joule/$m^2$) received by the first and second portions of the substrate. Similarly, the above-noted irradiance's discrepancy can be reconciled by configuring the chuck to move from a spot that is vertically non-overlap with ion source's outlet to another spot that is vertically overlapped with ion source's outlet (e.g., chuck can be moved along a direction from a horizontal projected spot of the second portion of the substrate to another horizontal projected spot of the first portion of the substrate). Such chuck movement can extend and shorten the exposure time on the first and second portions of the substrate, respectively, thus equalizing the radiant exposure (e.g., joule/$m^2$) received by the first and second portions of the substrate.

To further reconcile the irradiance discrepancy, the ion source can include a multi-zone grid structure configured to provide a spatial-dependent irradiance for the substrate. For example, a first portion of the multi-zone grid structure that is proximate to a first edge portion of the ion source's outlet can receive a greater bias voltage than a second portion of the multi-zone grid structure that is proximate to a second edge portion of the ion source's outlet. Accordingly, the particle beams outputted proximate to the first edge portion of the ion source's outlet can have a greater kinetic energy than the particle beams outputted proximate to the second portion of the ion source's outlet. By placing the first and second portions of the substrate under the first and second edge portions of the ion source's outlet, the irradiance received by the first and second portions of the substrate can be equalized. A benefit of the present disclosure, among others, is to equalizing the radiant exposure received across the substrate, thus improving the yield and reliability of the elongation process.

FIG. 1 shows a plan view of a semiconductor device manufacturing system 100, according to some embodiments. Semiconductor device manufacturing system 100 can include a mainframe module 101, a transfer module 105, loading ports 107, and a control system 124.

Each of loading ports 107 can accommodate a substrate storage device 108 (sometimes referred to as a front opening unified pod (FOUP)). Substrate storage device 108 can be configured for temporarily storing a batch of substrates (e.g., semiconductor wafers, such as substrate 201 discussed below) in a controlled environment during intervals between the different processes in mainframe module 101. Substrate storage device 108 can include a purging system (not shown) to reduce humidity and contamination from the environment. The purging system can include one or more gas inlet tubes (not shown) configured to supply a purging gas into substrate storage device 108. The purging systems can also include one or more outlets (not shown) configured to extract the purging gas from substrate storage device 108.

Transfer module 105 can be configured to provide a transfer conduit to transfer substrates (e.g., semiconductor wafers) between loading ports 107 and mainframe module 101 in an atmosphere environment or in a vacuum environment. Transfer module 105 can include a robotic arm 113 configured to receive the substrates from loading ports 107 and processing module 101. Robotic arm 113 can be further configured to transport the substrates between loading ports 107 and mainframe module 101. In some embodiments, robotic arm 113 can be configured as a substrate holder to temporarily hold the substrates. In some embodiments, robotic arm 113 can be configured to transfer substrates between the substrate orientation stage, loading ports 107, and mainframe module 101. In some embodiments, transfer module 105 can further include a substrate orientation stage (not shown in FIG. 1) configured to adjust an orientation of each substrate towards a direction for a semiconductor manufacturing process to be performed on the substrate.

Mainframe module 101 can include a hub 104, valves 140, and one or more processing modules 102 connected to hub 104 through valves 140. Hub 104 can connect with transfer module 105 to receive or deliver the substrates (e.g., substrates 201; discussed below). Hub 104 can further dispatch the substrates to a designated processing module 102. In some embodiments, hub 104 can isolate the crosstalk of the moisture and/or the air between transfer module 105 and processing modules 102. For example, transfer module 105 can deliver the substrates to hub 104 with valves 140 being closed to isolate processing modules 102 from hub 104. Valves 140 can be opened to provide access between hub 104 and processing modules 102, in response to hub 104 reaching a designated vacuum level (e.g., $10^{-2}$ Torr) that corresponds to a reduced moisture level and/or a reduced air level.

Processing module 102 can perform semiconductor manufacturing processes on substrates (e.g., semiconductor wafers). The semiconductor manufacturing process performed by processing module 102 can include a dry etching process, such as an ion beam etching (IBE) process, a reactive ion etching (ME) process, an inductively coupled plasma (ICP) etching process, and an ion milling process. In some embodiments, the semiconductor manufacturing process performed by processing module 102 can further include a plasma-assisted deposition process, such as plasma enhanced chemical vapor deposition (PECVD) process and a plasma assisted atomic layer deposition (PEALD) process. In some embodiments, the semiconductor manufacturing process performed by processing module 102 can further include a thermal process, such as a rapid thermal annealing (RTA) process; an oxidation process, such as thermal oxidation process; a deposition process, such as a chemical vapor deposition (CVD) process; and, a microscopy process, such as a scanning electron microscopy (SEM) process. In some embodiments, each of processing modules 102 can perform semiconductor manufacturing processes different from one another. In some embodiments, a first group of processing modules 102 can perform identical semiconductor manufacturing processes as a second group of processing modules 102.

Control system 124 can include any suitable computer system (e.g., workstation and portable electronic device) configured to store/execute programs for performing/monitoring various operations of loading ports 107, transfer module 105, and mainframe module 101. In some embodiments, control system 124 can control/instruct transfer module 105 to deliver a substrate. In some embodiments, control system 124 can control/instruct mainframe module 101 to perform the semiconductor manufacturing process and/or deliver the substrate. In some embodiments, control system 124 can control/instruct a gas supply system 109 to provide an ambient gas and/or a processing gas to mainframe module 101. In some embodiments, control system 124 can control/instruct a gas extraction systems 110 to control a vacuum level of mainframe module 101.

Control system 124 can communicate (e.g., send instructions and receive data) with other components of semiconductor device manufacturing system 100 (e.g., loading ports 107, transfer module 105, and mainframe module 101) via communication links 126. Communication links 126 can include any suitable network connection mechanism, such as a communication bus, a local area network (LAN), and/or a WiFi network. In some embodiments, control system 124 can update the instructions or the stored programs based on the data received from other components of semiconductor device manufacturing system 100 via communication link 126.

Figure 2:
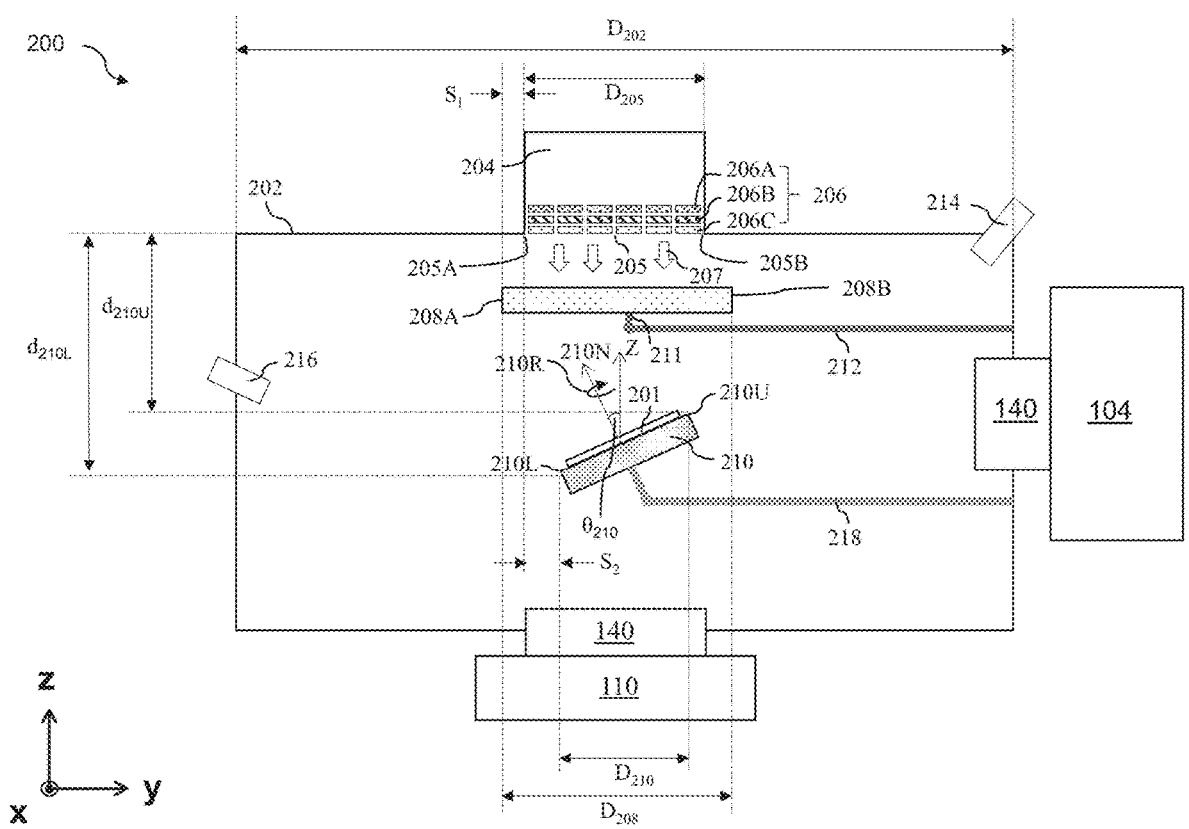
FIG. 2 illustrates a side view of a semiconductor device manufacturing system, according to some embodiments.
Figure 3:
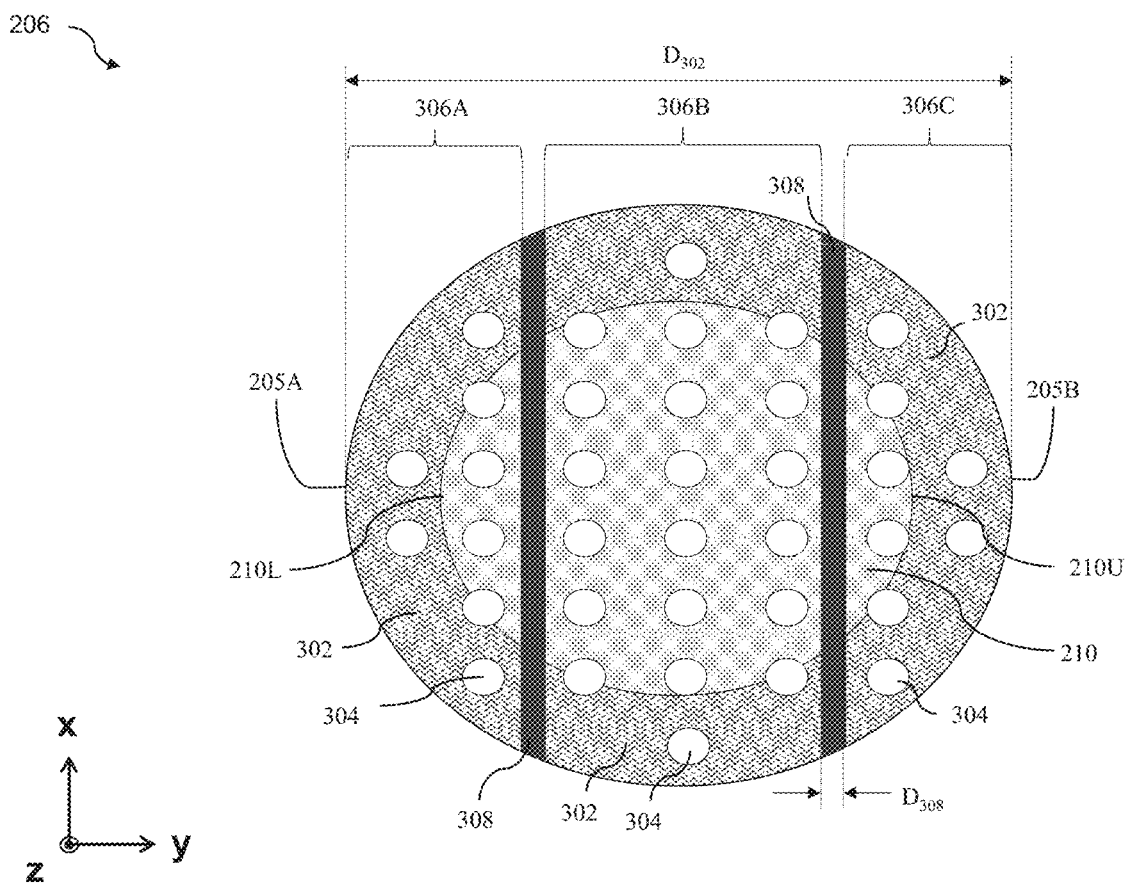
FIG. 3 illustrates a top view of a grid structure of a semiconductor device manufacturing system, according to some embodiments.
Figure 4:
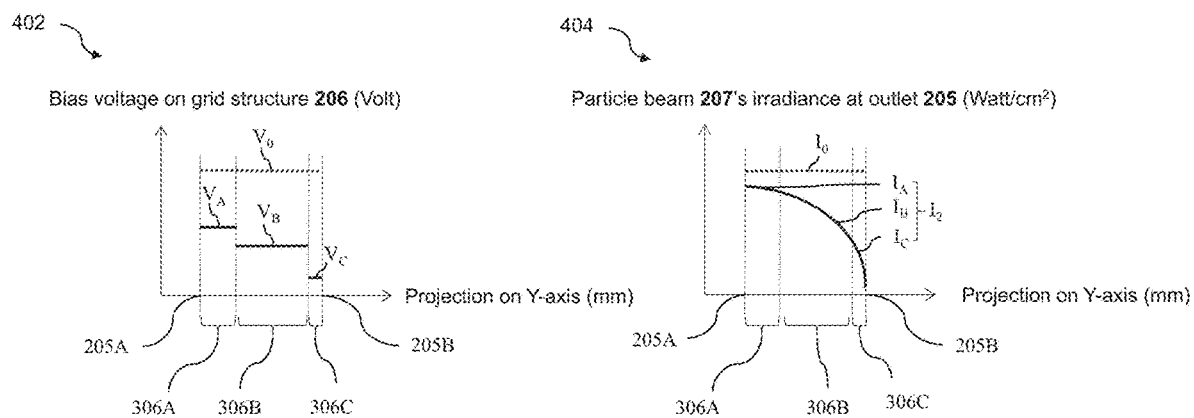
FIG. 4 illustrates bias voltage profiles and outputted irradiance profiles associated with a grid structure of a semiconductor device manufacturing system, according to some embodiments.
Figure 5:
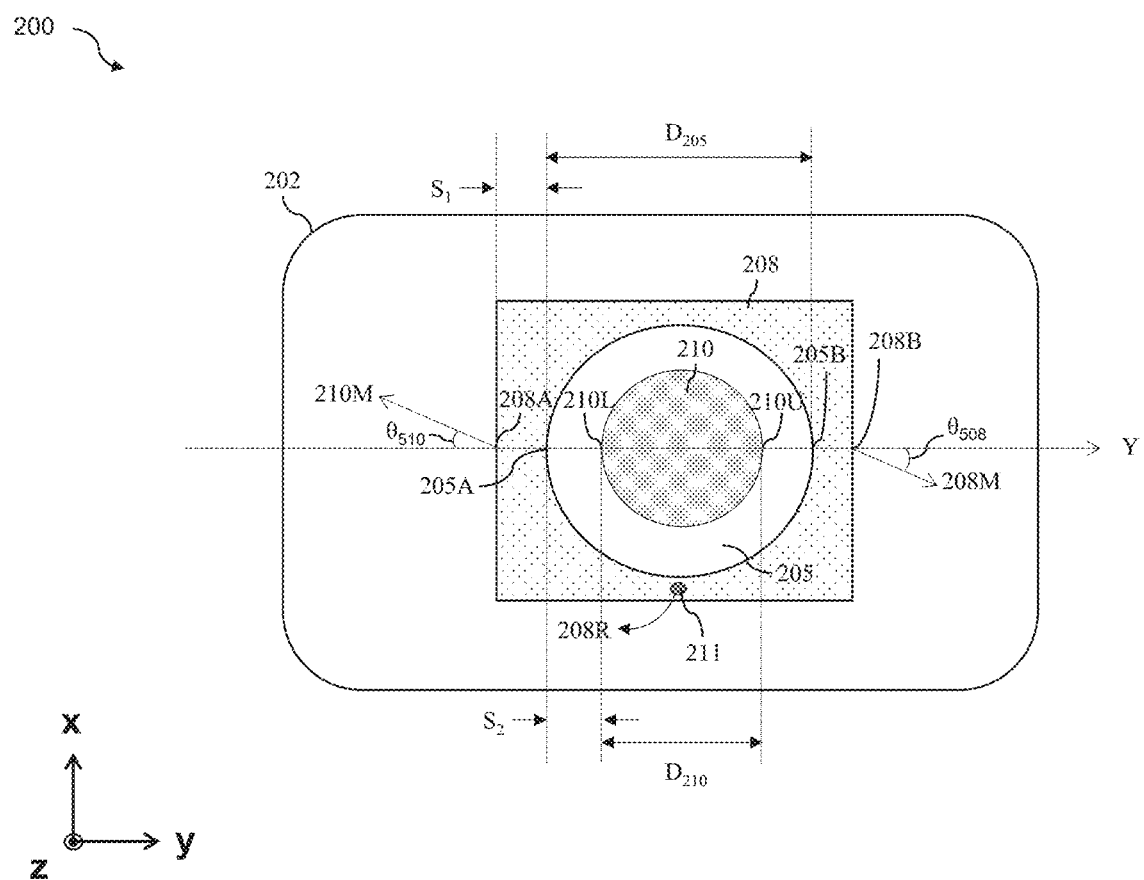
FIG. 5 illustrates positions and movements of various components of a semiconductor manufacturing system, according to some embodiments.

A processing module 200 is described with reference to FIGS. 2-5, according to some embodiments. FIG. 2 illustrates a side view of a processing module 200, according to some embodiments. FIG. 3 illustrates a top view of a grid stricture 206 of processing module 200, according to some embodiments. FIG. 4 illustrates profiles of grid structure 206's bias voltages and profiles of respective irradiance outputted by ion source 204, according to some embodiments. FIG. 5 illustrates a top view of processing module 200, according to some embodiments.

Processing module 200 can be an embodiment of processing module 102. For example, processing module 200 can be configured to receive a substrate 201 (e.g., a semiconductor wafer) and perform an IBE process on substrate 201. In some embodiments, the IBE process performed on substrate 201 can be an elongation process. In some embodiments, processing module 200 can be configured to perform an RIE process on substrate 201 or perform an ICP process on substrate 201. In some embodiments, processing module 200 can be configured to perform a plasma-assisted deposition process, such as a plasma-enhanced chemical vapor deposition process and a plasma-enhanced atomic layer deposition process, on substrate 201. The discussion of processing module 102 applies to processing module 200, unless mentioned otherwise. Further, the discussion of elements with the same annotations in FIGS. 1-5 applies to each other unless mentioned otherwise.

Referring to FIG. 2, processing module 200 can include a chamber 202 configured to provide a high vacuum environment to perform the semiconductor manufacturing process, such as an IBE process and an RIE process, on substrate 201. For example, chamber 202 can be connected to gas extraction system 110 through valve 140 to determine a vacuum level in chamber 202. Chamber 202 can be further connected to hub 104 through valve 140 to receive substrate 201. Chamber 202 can have a suitable horizontal (e.g., along the y-direction or along the x-y plane) dimension $D_{202}$, such as greater than about 25 inches, that is sufficient to accommodate moving ranges of processing module 200's other elements (e.g., chuck 210 and/or shutter 208, described below).

Processing module 200 can further include an ion source 204 housed in chamber 202. Ion source 204 can be configured to ionize one or more processing gases received from gas supply system 109 (not shown in FIG. 2) to generate particle beams 207. Ion source 204 can be further configured to output particle beams 207, such as plasmas, radicals, and/or ion beams, through ion source 204's outlet 205. Ion source 204's outlet 205 can be substantially coplanar with the x-y plane (e.g., outlet 205's normal can be substantially parallel to the z-direction). Ion source 204's outlet 205 can have a suitable horizontal (e.g., along the y-direction, along the x-direction, or along the x-y plane) dimension $D_{205}$, such as about 20 inches, between two opposite outlet 205's edge portions 205A and 205B. In some embodiments, edge portions 205A and 205B can be at opposite sides of outlet 205's geometric center. In some embodiments, a vector from edge portion 205A to edge portion 205B can substantially pass through proximities of outlet 205's geometric center. In some embodiments, processing module 200 can further include a neutralizer 214 proximate to outlet 205's edge portions 205A or 205B and configured to neutralize charges within particle beams 207 outputted by outlet 205.

Referring to FIGS. 2-4, ion source 204 can further include a grid structure 206 (shown in FIG. 2) disposed proximate to outlet 205. Grid structure 206 can be configured to determine an irradiance of particle beams 207 outputted at outlet 205. As shown in FIG. 3, grid structure 206 can include a conductive plate 302 and multiple apertures 304 formed through conductive plate 302. Conductive plate 302 can be made of any suitable conductive material, such as a metallic material, a carbon-contained material, and a conductive coating material, Conductive plate 302 can be placed laterally (e.g., along the y-direction, along the x-direction, or along the x-y plane) between outlet 205's edge portions 205A and 205B. In some embodiments, conductive plate 302 can have a horizontal (e.g., along the y-direction, along the x-direction, or along the x-y plane) dimension $D_{302}$ substantially equal to or less than outlet 205's horizontal (e.g., along the y-direction, along the x-direction, or along the x-y plane) dimension $D_{205}$.

Conductive plate 302 can be connected to a power source (not shown in FIGS. 2-4) to receive a bias voltage to control particle beams 207 moving through apertures 304 and towards chuck 210. For example, as shown in FIG. 4, conductive plate 302 can be biased with a voltage $V_0$ (shown in profile 402) to assist particle beams 207 moving through apertures 304 and outlet 205. With portions of conductive plate 302 proximate to outlet 205's edge portions 205A and 205B being biased with a substantially identical voltage $V_0$, particle beams 207 outputted from outlet 205 can have a substantially uniform irradiance $I_0$ (shown in profile 404) between outlet 205's edge portions 205A and 205B. In some embodiments, as shown in FIG. 2, ion source 204 can include multiple grid structures 206, such as grid structures 206A-206C that are vertically (e.g., along the z-direction) separated from one another. Each of grid structures 206A-206C can be connected to different power sources (not shown in FIG. 2) to receive different bias voltages. In some embodiments, grid structure 206A can be configured to accelerate particle beams 207 to determine particle beams 207's kinetic energy. In some embodiments, grid structure 206B can be configured to determine the trajectory of particle beams 207 towards chamber 202. In some embodiments, grid structure 206C can be configured to prevent particle beams 207 from back-streaming towards grid structure 206A and/or grid structure 206B. In some embodiments, apertures 304 of each grid structures 206A-206C can be substantially overlapped with one another along a vertical direction (e.g., the z-direction). In some embodiments, geometric centers of each apertures 304 of each grid structures 206A-206C can be substantially aligned with one another along a vertical direction (e.g., the z-direction).

In some embodiments, referring to FIG. 3, grid structure 206 can further include one or more insulating stripes 308 that can electrically insulate multiple portions (e.g., portions 306A-306C) of conductive plate 302 from one another. Insulating stripes 308 can be made of any suitable insulating material, such as Teflon and rubber. Insulating Stripe 308 can be vertically (e.g., in the z-direction) formed through conductive plate 302 and horizontally (e.g., along the x-direction) extending through conductive plate 302 to define portions 306A-306C. Accordingly, as shown in FIG. 3, insulating stripes 308 can divide conductive plate 302 into portions 306A-306C that are electrically insulated from one another. Portions 306A-306C can therefore receive different bias voltages to output particle beams 207 with a spatial-variant irradiance. For example, as shown in FIG. 4, portions 306A, 306B, and 306C can be connected to different power sources (not shown in FIGS. 2-4) to receive bias voltages $V_A$, $V_B$, and $V_C$ (shown in profile 402), respectively. Accordingly, particle beams 207 outputted from outlet 205 can have a spatial-dependent irradiance $I_2$ (shown in profile 404) with average irradiances $I_A$, $I_B$, and $I_C$ under and proximate to portions 306A, 3068, and 306C, respectively. In some embodiments, each of the average outputted irradiances $I_A$-$I_C$ can be positively correlated (e.g., positively linear to) to each of the bias voltages $V_A$-$V_C$ applied to conductive plate 302's multiple portions 306A-306C.

In some embodiments, portions 306A and 306C can be at two opposite edge portions of conductive plate 302 proximate to outlet 205's edge portions 205A and 205B, respectively. In some embodiments, portions 306A and 306C can be at two opposite edge portions of conductive plate 302, where chuck 210's edge portions 210L and 210U can be located under portions 306A and 306C, respectively. In some embodiments, portions 306A, 306B, and 306C can be made of different conductive materials. In some embodiments, a ratio of insulating stripe 308's width $D_{308}$ to conductive plate 302's horizontal dimension $D_{302}$ can be from about 0.01 to about 0.25, from about 0.01 to about 0.2, from about 0.01 to about 0.15, from about 0.03 to about 0.15, or from about 0.05 to about 0.15. If the ratio of width $D_{308}$ to horizontal dimension $D_{302}$ is below the above-noted lower limits, insulating stripe 308 may not provide sufficient electrical insulation between two adjacent portions of conductive plate 302. If the ratio of width $D_{308}$ to horizontal dimension $D_{302}$ is beyond the above-noted upper limits, insulating stripe 308 may shield portions of underlying outlet 205 from outputting particle beams 207, thus causing a non-uniform etching process or deposition process on substrate 201. In some embodiments, an insulating stripe 308 can be substantially parallel to another insulating stripe 308. In some embodiments, an insulating stripe 308 can intersect with another insulating stripe 308.

Referring to FIG. 2, processing module 200 can further include a chuck 210 housed in chamber 202. Chuck 210 can support substrate 201 for performing the semiconductor manufacturing processes (e.g., the IBE process and/or the elongation process) on substrate 201. For example, substrate 201 can be placed over chuck 210 and between chuck 210's two opposite edge portions 210L and 210U. Edge portions 210L and 210U can be vertically separated from outlet 205 with separations $d_{210L}$ and $d_{210U}$, respectively. In some embodiments, the terms "vertically separated from," "vertically displaced from," "vertical separation," and the like can refer to a separation between two objects' vertical projections (e.g., projections on the z-axis), regardless the horizontal (e.g., in the x-y plane) separation between the two objects. In some embodiments, edge portions 210L and 210U can be at opposite sides of chuck 210's geometric center. In some embodiments, a vector from edge portion 210L to edge portion 210U can substantially pass through proximities of chuck 210's geometric center. Chuck 210 can be configured to rotate substrate 201 (e.g., rotation 210R) on substrate 201's normal 210N.

Chuck 210 can be further configured to tilt substrate 201 on the x-axis and/or on the y-axis. For example, chuck 210 can tilt substrate 201 on the x-axis to adjust an acute angle $\theta_{210}$ between substrate 201's normal 210N and the z-axis (e.g., the y-axis can be substantially parallel to a horizontal projection of a vector from edge portion 210L to edge portion 210U). Acute angle $\theta_{210}$ can be from about 0 degrees to about 90 degrees or from about 5 degrees to about 85 degrees that are suitable for the IBE process or the elongation process. In response to acute angle $\theta_{210}$ being greater than zero (e.g., chuck 210 is tilted with respect to outlet 205), one of edge portions 210L and 210U can be closer to ion source 204's outlet 205 than another of edge portions 210L and 210U (e.g., one of separations $d_{210U}$ and $d_{210L}$ can be less than another of separations $d_{210U}$ and $d_{210L}$). Further, with acute angle $\theta_{210}$ being greater than or substantially equal to zero, a horizontal (e.g., in the y-direction) projected dimension $D_{210}$ between edge portions 210L and 210U can be less than outlet 205's horizontal (e.g., in the y-direction) dimension $D_{205}$ to ensure the entire substrate 201 receives particle beams 207 from ion source 204. For example, outlet 205's horizontal dimension $D_{205}$ can be from about 20 inches to about 30 inches, and chuck 210's horizontal (e.g., in the y-direction) projected dimension $D_{210}$ can be from about 15 inches to about 20 inches to ensure the entire substrate 201 receives particle beams 207 from ion source 204. In some embodiments, chuck 210 can be configured to heat up or cool down substrate 201 thereon. In some embodiments, processing module 200 can further include an end-point detector 216 disposed above chuck 210 and configured to determine an etch end-point of a film on substrate 201.

Referring to FIGS. 2 and 5, processing module 200 can further include a motion mechanism 218 (shown in FIGS. 2 and 5) configured to translationally and/or rotationally move chuck 210 within chamber 202. For example, motion mechanism 218 can vertically (e.g., in the z-direction) move chuck 210 to adjust an average vertical (e.g., in the z-direction) separation, such as an average of separations $d_{210L}$ and $d_{210U}$, between chuck 210 and ion source 204's outlet 205. In some embodiments, the average vertical separation between chuck 210 and outlet 205 can refer to a vertical separation between chuck 210's geometric center and outlet 205's geometric center. Further, motion mechanism 218 can horizontally (e.g., in the x-direction; in the y-direction; or along the x-y plane) move chuck 210 within chamber 202. For example, motion mechanism 218 can horizontally locate chuck 210 under outlet 205 with a suitable horizontal (e.g., in the y-direction) separation $S_2$, such as from about 0.1 inches to about 2 inches, between chuck 210's perimeter (e.g., edge portions 210L and/or 210U) and outlet 205's perimeter (e.g., edge portions 205A and/or 205B) to ensure the entire substrate 201 receives particle beams 207 from ion source 204. In some embodiments, the terms "horizontal separated from," "horizontal displaced from," "horizontal separation," and the like can refer to a separation between two objects' horizontal projections (e.g., projections on the y-axis), regardless of the vertical (e.g., in the z-direction) separation between the two objects. In some embodiments, with chuck 210's edge portion 210U being vertically (e.g., in the z-direction) closer to ion source 204's outlet 205 than chuck 210's edge portion 210L (e.g., chuck 210 is tilted with respect to outlet 205), motion mechanism 218 can move chuck 210 along a horizontal direction 210M (e.g. shown in FIG. 5; towards FIG. 5's left) that has an acute angle $\theta_{510}$ (shown in FIG. 5) with respect to a horizontal projection of a vector from edge portion 210U to edge portion 210L (e.g., the opposite of y-axis; towards FIG. 5's left) to perform the elongation process (discussed in method 600). In some embodiments, acute angle $\theta_{510}$ can be substantially equal to zero (e.g., horizontal direction 210M can be substantially parallel to the y-axis).

Referring to FIG. 2, processing module 200 can further include a shutter 208 housed in chamber 202 and configured to control a pass-through of particle beams 207 towards substrate 201. An average vertical (e.g., in the z-direction) separation between shutter 208 and ion source 204's outlet 205 can be less than that between chuck 210 and ion source 204's outlet 205. Shutter 208 can have a horizontal (e.g., in the y-direction) dimension $D_{208}$, such as from about 20 inches to about 25 inches, between shutter 208's two opposite edge portions 208A and 208B. In some embodiments, edge portions 208A and 208B can be at opposite sides of shutter 208's geometric center. In some embodiments, a vector from edge portion 208A to edge portion 208B can substantially pass through proximities of shutter 208's geometric center. Shutter 208's horizontal (e.g., in the y-direction) dimension $D_{208}$ can be greater than outlet 205's horizontal dimension $D_{205}$ to ensure completely shielding chuck 210 from ion source 204's outlet 205, according to some embodiments. In some embodiments, shutter 208's area can be greater than outlet 205's area to ensure completely shielding chuck 210 from ion source 204's outlet 205. In some embodiments, shutter 208 can be substantially parallel to outlet 205.

Referring to FIGS. 2 and 5, processing module 200 can further include a motion mechanism 212 (shown in FIG. 2; not shown in FIG. 5) configured to translationally and/or rotationally move shutter 208 within chamber 202. For example, motion mechanism 212 can rotate shutter 208 to a vertical (e.g., parallel to the z-axis) axis that passes through shutter 208's back surface 211. Further, motion mechanism 212 can horizontally (e.g., in the x-direction; in the y-direction, or along the x-y plane) move shutter 208 within chamber 202. For example, motion mechanism 212 can horizontally locate shutter 208 under outlet 205 with a suitable horizontal (e.g., in the y-direction) separation $S_1$, such as from about 0.1 inches to about 2 inches, between shutter 208's perimeter (e.g., edge portions 208A and/or 208B) and outlet 205's perimeter (e.g., edge portions 205A and/or 205B) to ensure completely shielding chuck 210 from ion source 204's outlet 205, according to some embodiments. In some embodiments, with chuck 210's edge portion 210U being vertically (e.g., in the z-direction) closer to ion source 204's outlet 205 than chuck 210's edge portion 210L (e.g., chuck 210 is tilted with respect to outlet 205), motion mechanism 212 can move shutter 208 along a horizontal direction 208M (shown in FIG. 5; towards FIG. 5's right) that has an acute angle $\theta_{508}$ (shown in FIG. 5) with respect to a horizontal projection of a vector from edge portion 210L to edge portion 210U (e.g., the y-axis; towards FIG. 5's right) to perform the elongation process (discussed in method 600). In some embodiments, acute angle $\theta_{508}$ can be substantially equal to zero (e.g., horizontal direction 208M can be substantially parallel to the y-axis).

Figure 6:
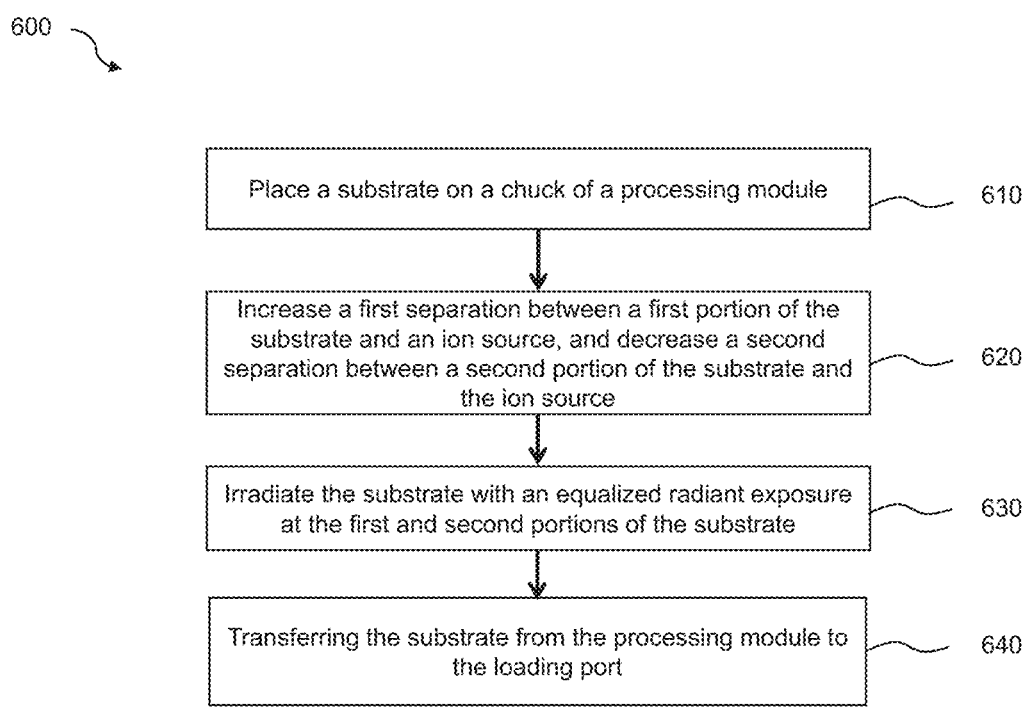
FIG. 6 illustrates a flow chart of a method for operating a semiconductor device manufacturing system, according to some embodiments.
Figure 7:
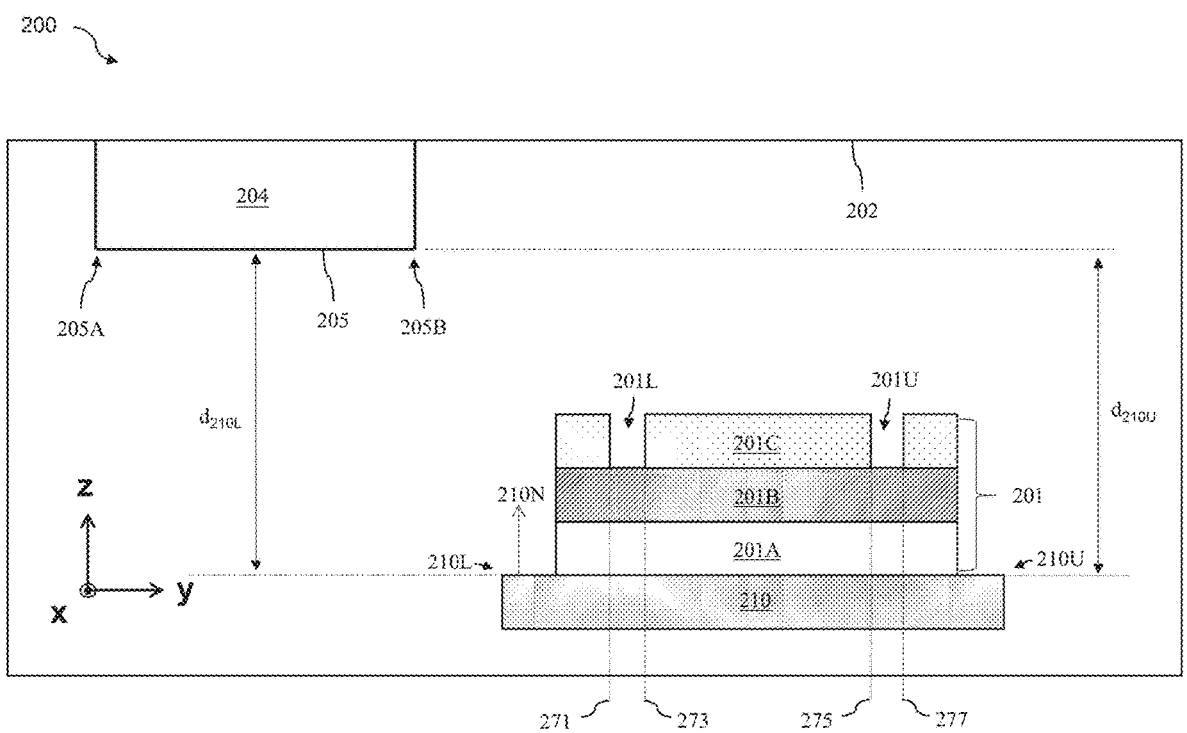
FIG. 7 illustrates an operation stage of a semiconductor device manufacturing system, according to some embodiments.
Figure 8:
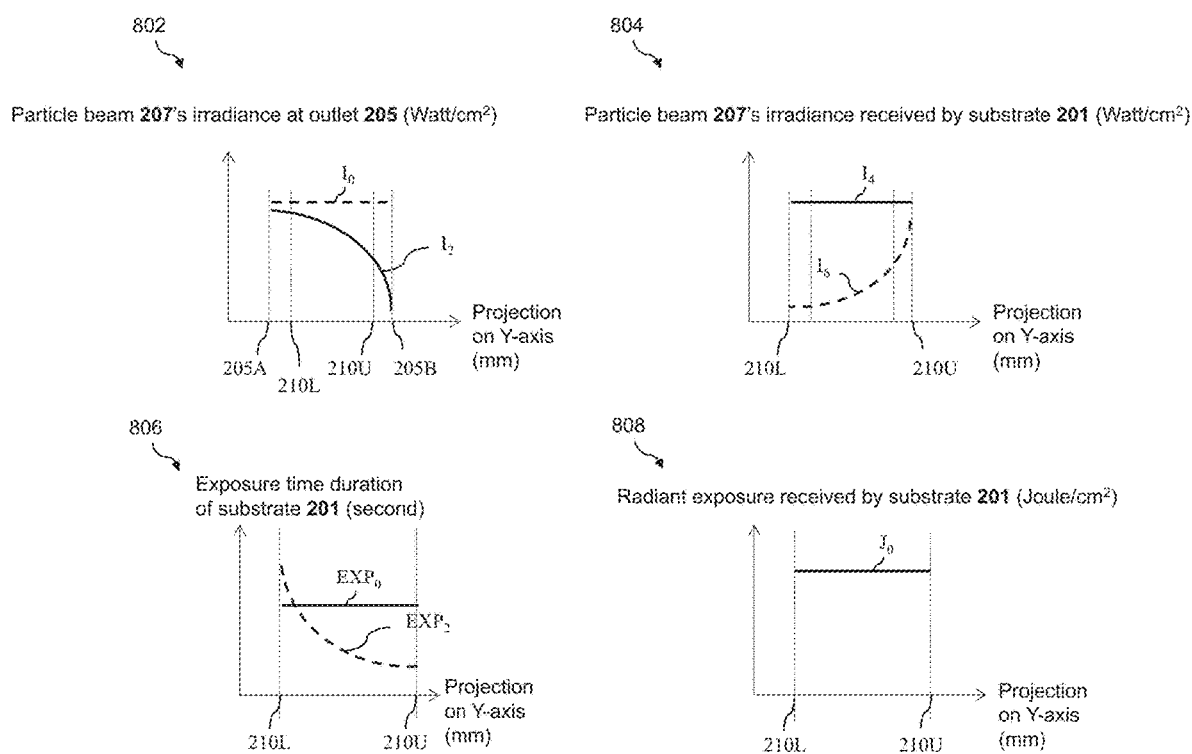
FIG. 8 illustrates irradiance profiles, exposure time profiles, and a radiant energy profile voltage profiles associated with a semiconductor device manufacturing system, according to some embodiments.
Figure 9:
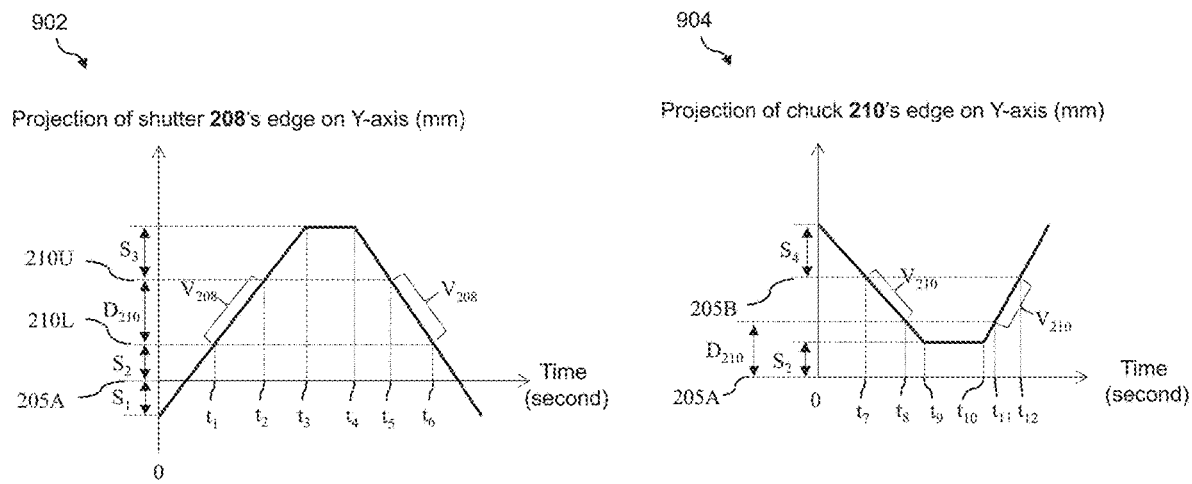
FIGS. 9-19 illustrate various operation stages of a semiconductor device manufacturing system, according to some embodiments.
Figure 10:
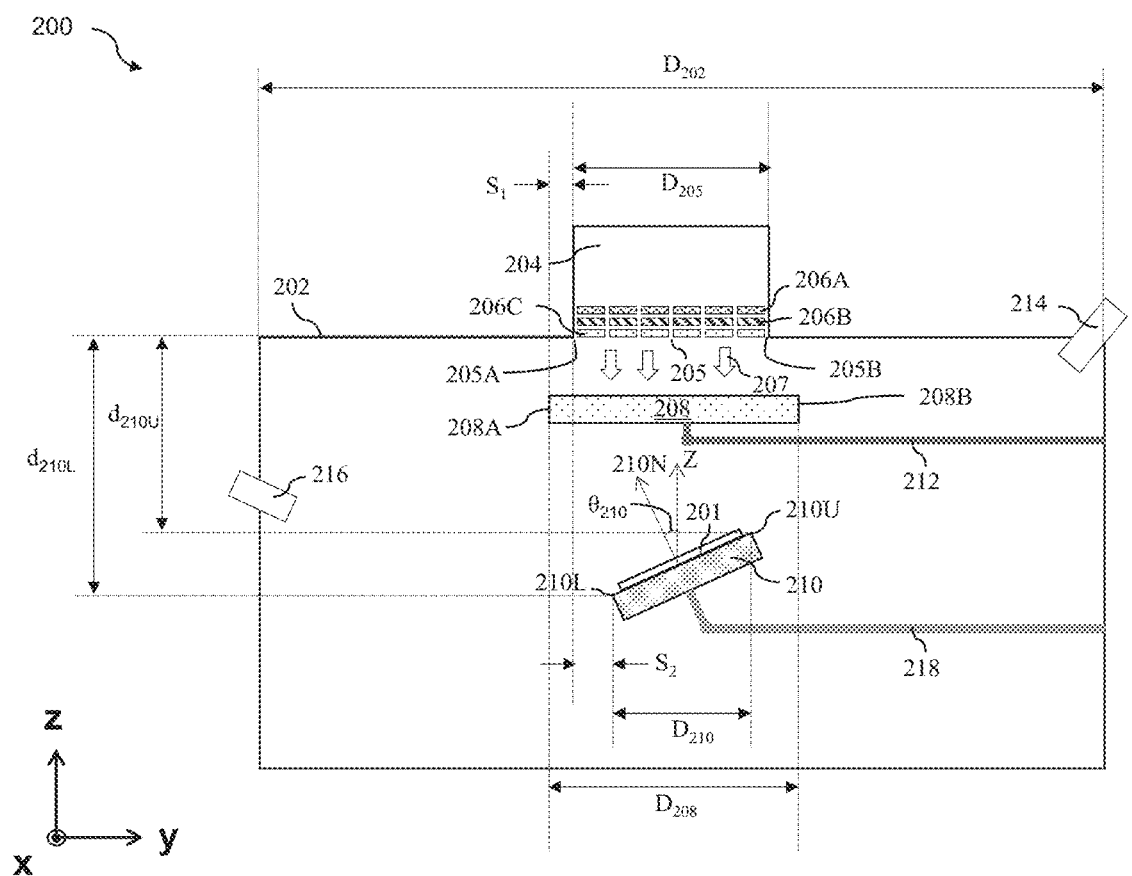
Figure 20:
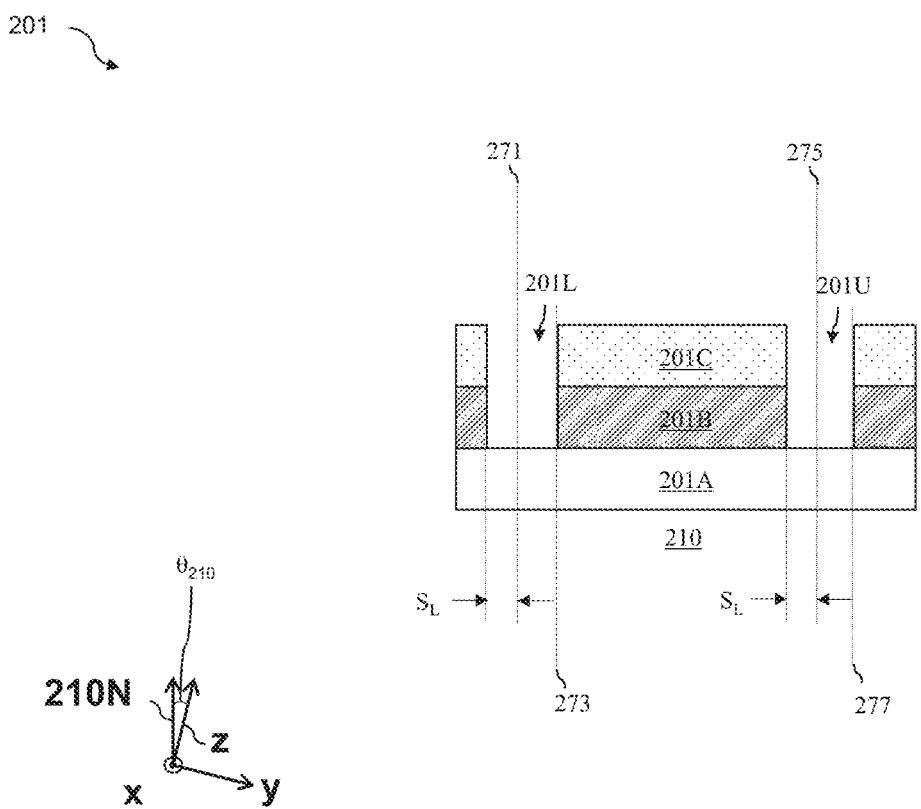
FIG. 20 illustrates a side view of a substrate processed by a semiconductor device manufacturing system, according to some embodiments.
Figure 21:
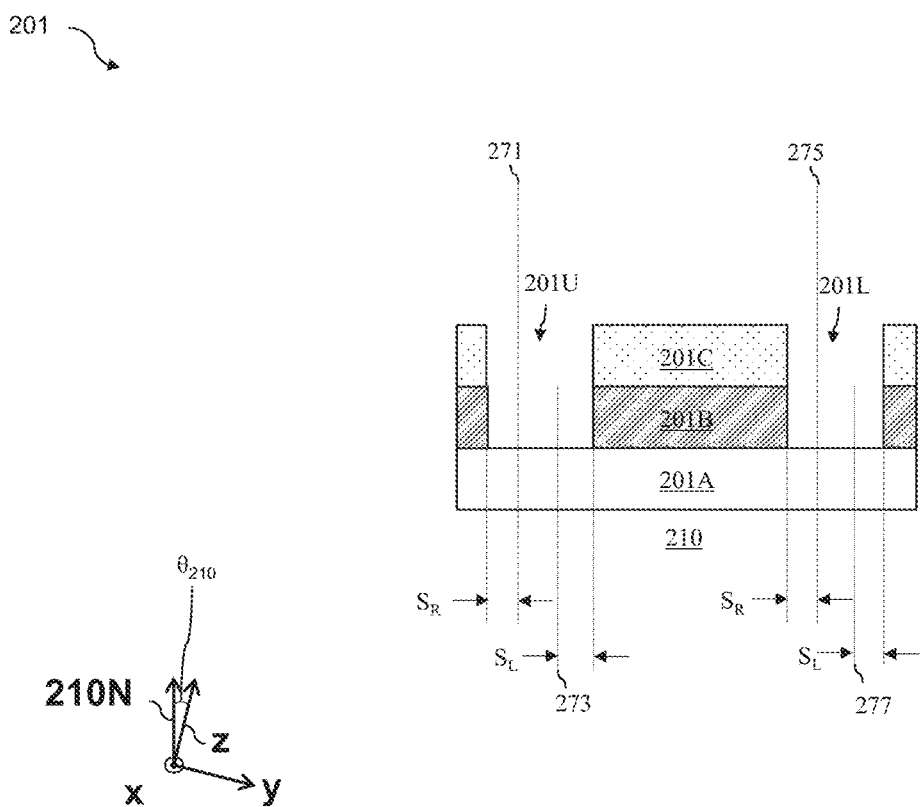
FIG. 21 illustrates a side view of a substrate processed by a semiconductor device manufacturing system, according to some embodiments.

FIG. 6 is a method 600 for operating a semiconductor device manufacturing system 100, according to some embodiments. For illustrative purposes, the operations illustrated in FIG. 6 will be described with reference to the example operation process for operating semiconductor device manufacturing system 100 as illustrated in FIGS. 7-21. FIG. 7 illustrates a stage of operating semiconductor device manufacturing system 100, according to some embodiments, FIGS. 8 and 9 illustrate various operating conditions of semiconductor device manufacturing system 100, according to some embodiments. FIGS. 10-19 illustrate various stages of operating semiconductor device manufacturing system 100, according to some embodiments. FIGS. 20 and 21 illustrate substrate 201's structures during or after the operating stage of FIG. 14, according to some embodiments. FIGS. 20 and 21 also illustrate substrate 201's structures during or after the operating stage of FIG. 19, according to some embodiments. Operations can be performed in a different order or not performed depending on specific applications. One or more other operations may be performed in addition to or in place of the presently described operations of method 600. Moreover, not all operations may be needed to perform the disclosure provided herein. Some of the operations may be performed simultaneously or in a different order than shown in FIG. 6. For illustrative purposes, method 600 is described with reference to FIGS. 1-5 and 7-21. However, method 600 is not limited to these embodiments. In addition, the discussion of elements in FIGS. 1-5 and 7-21 with the same annotations applies to each other, unless mentioned otherwise.

Referring to FIG. 6, in operation 610, a substrate is placed on a chuck of a processing module. For example, referring to FIGS. 1, 2, and 7, substrate 201 can be placed on semiconductor device manufacturing system 100's chuck 210. Operation 610 can begin with providing substrate 201, placing substrate 201 in substrate storage device 108 (shown in FIG. 1), and placing substrate storage device 108 in loading port 107 (shown in FIG. 1). Substrate 201 can have any suitable device layers with any suitable device patterns. For example, as shown in FIG. 7, substrate 201 can include a host layer 201A (e.g., a silicon substrate), a device layer 201B (e.g., a insulating film, a conductive film, or a semiconductor film) disposed over host layer 201A, and a mask layer 201C (e.g., a photoresist film) disposed over device layer 201B. Mask layer 201C can have suitable device patterns, such as openings 201L and 201U, to define patterns of device layer 201B. Opening 201L can be laterally (e.g., substantially perpendicular to substrate 201's normal 210N) positioned between line 271 and line 273. Opening 201U can be laterally (e.g., substantially perpendicular to substrate 201's normal 210N) positioned between line 275 and line 277. Other layer structures and device patterns of substrate 201 are within the spirit and scope of this disclosure.

Operation 610 can further include transferring substrate 201 from loading port 107 to transfer module 105 (shown in FIG. 1). For example, the substrate transfer operation between loading port 107 and transfer module 105 can include instructing robotic arm 113 to deliver substrate 201 between loading port 107 and transfer module 105. In some embodiments, the substrate transfer operation between loading port 107 and transfer module 105 can include purging an inert gas (e.g., nitrogen gas) in transfer module 105 to reduce an oxygen/moisture level in transfer module 105. In some embodiments, transfer module 105 can initially be in a vacuum environment, and the substrate transfer operation between loading port 107 and transfer module 105 can include venting transfer module 105 to an atmospheric pressure. In some embodiments, the substrate transfer operation between loading port 107 to transfer module 105 can include transferring substrate 201 from loading port 107 to transfer module 105's wafer orientation stage (not shown in FIG. 1) to adjust an orientation of substrate 201.

Operation 610 can further include transferring substrate 201 from transfer module 105 to processing module 102's chuck 210 (shown in FIG. 2). The substrate transfer operation between transfer module 105 and chuck 210 can include instructing hub 104's robotic arm (not shown in FIG. 2) to receive substrate 201 from transfer module 105 and deliver the received substrate 201 from hub 104 to the selected processing module 102's chuck 210 through valve 140. In some embodiments, the substrate operation between transfer module 105 and chuck 210 can further include matching a vacuum level between hub 104 and transfer module 105. For example, prior to transferring substrate 201 between transfer module 105 and hub 104, transfer module 105 can be pumped down by gas extraction system 110 to match hub 104's vacuum level. In some embodiments, the substrate transferring operation between transfer module 105 and chuck 210 can further include matching a vacuum level between hub 104 and the selected processing module 102. For example, prior to transferring substrate 201 between hub 104 and the selected processing module 102's chuck 210, hub 104 can be pumped down by gas extraction system 110 to a vacuum level substantially equal to or below the selected processing module 102's vacuum level.

In some embodiments, the substrate operation between transfer module 105 and chuck 210 can further include placing substrate 201 between chuck 210's two opposite edge portions 210L and 210U. For example, as shown in FIG. 7, a first portion of substrate 201 that includes the patterned opening 201L can be placed proximate to chuck 210's edge portion 210L, and a second portion of substrate 201 that includes the patterned opening 201U can be placed proximate to chuck 210's edge portion 210U. In some embodiments, the substrate operation between transfer module 105 and chuck 210 can further include leveling chuck 210 with ion source 204's outlet 205. For example, as shown in FIG. 7, chuck 210 can be substantially parallel to outlet 205, and therefore separations $d_{210L}$ and $d_{210U}$ can be substantially equal to each other. In some embodiments, after operation 610, chuck 210 can be vertically (e.g., along the z-direction) outside outlet 205's perimeter. For example, as shown in FIG. 7, chuck 210's edge portions 210L and 210U can be laterally displaced from outlet 205's edge portions 205A and 205B after operation 610. In some embodiments, after operation 610, chuck 210 can be vertically (e.g., along the z-direction) overlapped with outlet 205 (not shown in FIG. 7).

Referring to 6, in operation 620, a first separation between a first portion of the substrate and an ion source is increased, and a second separation between a second portion of the substrate and the ion source is decreased. For example, referring to FIG. 2, separation $d_{210L}$ between outlet 205 and chuck 210's edge portion 210U (e.g., proximate to substrate 201's first portion that includes opening 201L) can be increased, and separation $d_{210U}$ between outlet 205 and chuck 210's edge portion 210U (e.g., proximate to substrate 201's second portion that includes opening 201U) can be decreased. In some embodiments, the process of increasing separation $d_{210L}$ and decreasing separation $d_{210U}$ can include tilting chuck 210 to a horizontal axis (e.g., an x-axis) to adjust acute angle $\theta_{210}$ between substrate 201's normal 210N and outlet 205's normal (e.g., outlet 205's normal can be substantially parallel to the z-axis; and the y-axis can be substantially parallel to a horizontal projection of a vector from substrate 201's first portion to substrate 201's second portion). In some embodiments, the process of increasing separation $d_{210L}$ and decreasing separation $d_{210U}$ can include tilting ion source 204' outlet 205 to a horizontal axis (e.g., an x-axis) to adjust acute angle $\theta_{210}$ between substrate 201's normal 210N and outlet 205's normal (e.g., parallel to the z-axis). In some embodiments, the process of increasing separation $d_{210L}$ and decreasing separation $d_{210U}$ can further include vertically (e.g., in the z-direction) adjusting an average vertical separation (e.g., the average of separations $d_{210L}$ and $d_{210U}$) between chuck 210 and outlet 205. With a non-zero acute angle $\theta_{210}$ between substrate 201 and outlet 205, particle beams 207 can laterally etch device layer 201B proximate to opening 201L and 201U to conduct the elongation process (discuss at operation 630).

Referring to FIG. 6, in operation 630, the substrate is irradiated with an equalized radiant exposure at the first and second portions of the substrate. For example, referring to FIG. 2, substrate 201, which is tilted of acute angle $\theta_{210}$ with respect to outlet 205, can be irradiated with particle beams 207. Further, referring to FIG. 8's profile 808, substrate 201's first portion (e.g., proximate to chuck 210's edge portion 210L; vertically far from outlet 205) and substrate 201's second portion (e.g., proximate to chuck 210's edge portion 210U; vertically close to outlet 205) can receive a substantially equalized (e.g., substantially identical) radiant exposure $J_0$ from particle beams 207. In some embodiments, substrate 201's other portion, such as the portion between substrate 201's first portion and substrate 201's second portion, can receive a substantially equalized radiant exposure $J_0$ from particle beams 207. In some embodiments, since substrate 201's first portion and substrate 201's second portion can receive substantially identical radiant exposure $J_0$ from particle beams 207, substrate 201's first portion and substrate 201's second portions can exhibit substantially identical fabrication signatures with each other after or during operations 630. For example, as shown in FIG. 20, substrate 201 can receive particle beams 207 to laterally (e.g., substantially perpendicular to substrate 201's normal 210N) etch device layer 201B of substantially identical etching depths $S_L$ (measured from line 271 and line 275, respectively) proximate to opening 201L (e.g., located at substrate 201's first portion) and proximate to opening 201U (e.g., located at substrate 201's second portion). In some embodiments, substrate 201 can receive particle beams 207 to further laterally (e.g., substantially perpendicular to substrate 201's normal 210N) etch mask layer 201C of substantially identical etching depths $S_L$ (measured from line 271 and line 275, respectively) to enlarge opening 201L and opening 201U, In some embodiments, as shown in FIG. 21, substrate 201 can receive particle beams 207 to laterally (e.g., substantially perpendicular to substrate 201's normal 210N) etch device layer 201B of substantially identical etching depths $S_R$ (measured from line 273 and line 277, respectively; extended at an opposite direction with respect to etching depth $S_L$) proximate to opening 201L (e.g., located at substrate 201's first portion) and proximate to opening 201U (e.g., located at substrate 201's second portion). In some embodiments, substrate 201 can receive particle beams 207 to further laterally (e.g., substantially perpendicular to substrate 201's normal 210N) etch mask layer 201C of substantially identical etching depths $S_R$ (measured from line 273 and line 277, respectively) to enlarge opening 201L and opening 201U.

In some embodiments, operation 630 can be operated by providing a spatial-dependent irradiance to irradiate substrate 201 (e.g., a variable irradiance mode). In some embodiments, the term "spatial-dependent irradiance" can refer to a particle beam's irradiance magnitudes at different locations of the x-y plane can be different from one another. Operation 630 configured with a variable irradiation mode can include (i) locating chuck 210 vertically (e.g., in the z-direction) under outlet 205 and horizontally (e.g., in the x-y plane) within outlet 205's perimeter, and (ii) outputting particle beams 207 with a spatial-dependent irradiance at outlet 205. As shown in FIGS. 2 and 5, the process of locating chuck 210 can include locating, via motion mechanism 218, chuck 210's edge portions 210L and 210U vertically (e.g., in the z-direction) under outlet 205 and horizontally (e.g., in the x-y plane) overlapped with outlet 205. In some embodiments, the process of location chuck 210 can include locating chuck 210 under outlet 205 while ion source 204 can be deactivated (e.g., outlet 205 does not output particle beams 207 before chuck 210 arrives under outlet 205). In some embodiments, the process of locating chuck 210 can further include vertically (e.g., in the z-direction) moving chuck 210 towards or away from outlet 205. The process of outputting particle beams 207 can include (i) providing one or more processing gases to ion source 204 by gas supply system 109, and (ii) generating particle beams 207 by performing an excitation process, a dislocation process, and/or an ionization process on the one or more processing gases in ion source 204.

With chuck 210 being vertically (e.g., in the z-direction) located under outlet 205 and tilted with respect to outlet 205, the process of outputting particle beams 207 can further include outputting particle beams 207 with a spatial-dependent irradiance $I_2$ (shown in FIG. 8's profile 802) at outlet 205. In some embodiments, the process of outputting particle beams 207 with the spatial-dependent irradiance $I_2$ at outlet 205 can include (i) providing grid structure 206 equipped with one or more insulating stripes 308 as described in FIG. 3 to ion source 204, and (ii) applying variable bias voltages to one or more portions of grid structure 206 (e.g., portions 306A-306C as shown in FIG. 3) as described in FIG. 4. For example, bias voltage $V_A$ (shown in FIG. 4) that is applied to grid structure 206's portion 306A (e.g., close to outlet 205's edge portion 205A and/or close to chuck 210's edge portion 210L) can be greater than bias voltage $V_C$ (shown in FIG. 4) that is applied to grid structure 206's portion 306C (e.g., close to outlet 205's edge portion 205B and/or close to chuck 210's edge portion 210U). Accordingly, as shown in FIG. 8's profile 802, the resulting particle beams 207's spatial-dependent irradiance $I_2$ can have a greater irradiance magnitude proximate to outlet 205's edge portion 205A (e.g., close to chuck 210's edge portion 210L) than proximate to outlet 205's edge portion 205B (e.g., close to chuck 210's edge portion 210L). With separation $d_{210L}$ (shown at FIG. 2) being greater than separation $d_{210U}$ (shown at FIG. 2) after operation 620, particle beams 207's irradiance decay can be greater at chuck 210's edge portion 210L than at chuck 210's edge portion 210U. Therefore, substrate 201's first and second portions, which is respectively close to chuck 210's edge portions 210L and 210U, can receive a substantially identical irradiance $I_4$ (shown at FIG. 8's profile 804) from the arrived particle beams 207. In other words, spatial-dependent irradiance $I_2$ can reconcile irradiance decay's discrepancy caused by the tilted substrate 201 (e.g., a non-zero acute angle $\theta_{210}$ between substrate 201 and outlet 205).

The process of outputting particle beams 207 can further include outputting particle beams 207 with shutter 208 being horizontally (e.g., in the x-y plane) located outside outlet 205's perimeter. With shutter 208 being not shielding chuck 210 from outlet 205, substrate 201's first and second portions can have an identical exposure time duration $EXP_0$ (shown in FIG. 8's profile 806) under particle beams 207. Accordingly, the radiant exposure (e.g., the integral of irradiance with exposure time duration) of substrate 201's first and second portions (e.g., proximate to chuck 210's edge portion 210L and 210U, respectively) can have a substantially equalized (e.g., substantially identical) radiant exposure $J_0$ (shown in FIG. 8's profile 808).

In some embodiments, operation 630 can be operated by irradiating substrate 201 with different exposure time durations on different portions of substrate 201 (e.g., a variable exposure mode). For example, operation 630 configured with a variable exposure mode can include (i) outputting particle beams 207 with a substantially constant (e.g., spatial-independent) irradiance $I_2$ (shown at FIG. 8's profile 802) at outlet 205, and (ii) irradiating substrate 201 with a spatial-dependent exposure time duration $EXP_2$ (shown in FIG. 8's profile 806) under particle beams 207. In some embodiments, the term "spatial-dependent exposure time duration" can refer to the exposure time durations on different portions of substrate 201 can be different from one another. The process of outputting particle beams 207 with substantially constant spatial-dependent irradiance $I_2$ at outlet 205 can include applying a substantially identical bias voltage to each portion of grid structure 206 as described in FIG. 4. For example, bias voltage $V_0$ (shown in FIG. 4) can be applied to each portion of grid structure 206. Accordingly, as shown in FIG. 8's profile 802, the resulting particle beams 207's irradiance $I_0$ can be have a substantially equal irradiance magnitude between outlet 205's edge portion 205A (e.g., close to chuck 210's edge portion 210L) and outlet 205's edge portion 205B (e.g., close to chuck 210's edge portion 210L).

With separation $d_{210L}$ (shown at FIG. 2) being greater than separation $d_{210U}$ (shown at FIG. 2) after operation 620, particle beams 207's irradiance decay can be greater at chuck 210's edge portion 210L than at chuck 210's edge portion 210U. Accordingly, with a substantially constant irradiance $I_0$ outputted at outlet 205, chuck 210's edge portion 210L can receive less irradiance from particle beams 207 than chuck 210's edge portion 210U. The discrepancy between the above-noted received irradiation can result in a spatial-dependent irradiance $I_6$ (shown at FIG. 8's profile 804) received by substrate 201. Namely, the average irradiance magnitude received by substrate 201's first portion (close to chuck 210's edge portions 210L) can be less than the average irradiance magnitude received by substrate 201's second portion (close to chuck 210's edge portions 210U).

The above-noted received irradiation's discrepancy between the first and second portions of substrate 201 can be mitigated by the spatial-dependent exposure time duration $EXP_2$, because the average exposure time duration proximate to substrate 201's first portion (close to chuck 210's edge portions 210L) can be greater than the average exposure time duration proximate to substrate 201's second portion (close to chuck 210's edge portions 210U), according to some embodiments. Accordingly, the radiant exposure (e.g., the integral of irradiance with exposure time duration) of substrate 201's first and second portions (e.g., proximate to chuck 210's edge portion 210L and 210U, respectively) can have a substantially equalized (e.g., substantially identical) radiant exposure $J_0$ (shown in FIG. 8's profile 808).

In some embodiments, referring to FIG. 5, FIG. 9's profile 902, and FIGS. 10-14, 20, and 21, the process of irradiating substrate 201 with the spatial-dependent exposure time duration (e.g., exposure time duration $EXP_2$) can be operated by moving shutter 208 to gradually expose substrate 201 to outlet 205 while ion source 204 is activated to output particle beams 207 through outlet 205 (e.g., a variable shutter exposure mode). For example, the process of irradiating substrate 201 with the spatial-dependent exposure time duration, configured with a variable shutter exposure mode, can include (i) locating shutter 208 vertically (e.g., in the z-direction) under outlet 205 and horizontally (e.g., in the x-y plane) masking outlet 205 from chamber 202 (shown in FIG. 5 and FIG. 10), (ii) locating chuck 210 vertically (e.g., in the z-direction) under shutter 208 and horizontally (e.g., in the x-y plane) within outlet 205's perimeter (shown in FIG. 5 and FIG. 10), and (iii) moving shutter 208 along horizontal direction 208M (shown in FIG. 5; towards FIG. 5's right) to gradually expose substrate 201 to outlet 205 with reference to FIGS. 9, 11-14, 20, and 21. In some embodiments, chuck 210 can be static while shutter 208 is moved along horizontal direction 208M.

Figure 11:
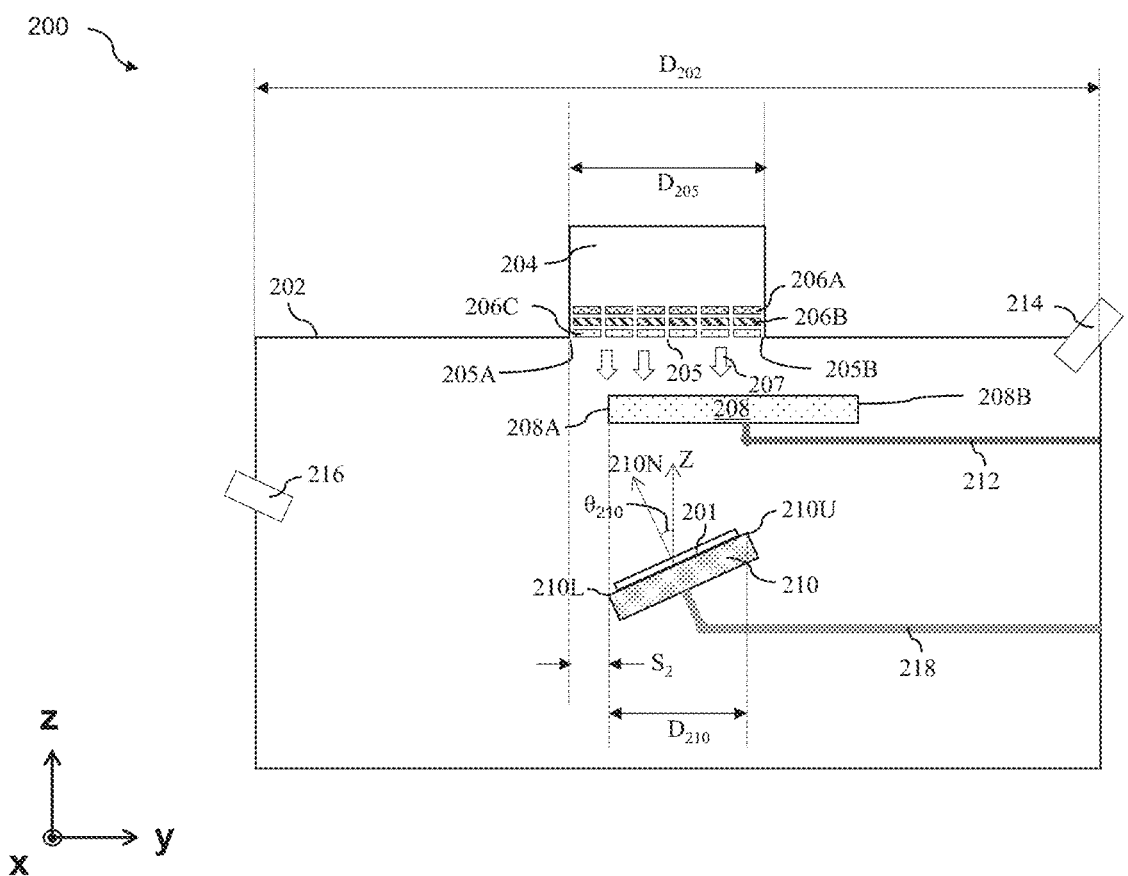

For example, referring to FIG. 9's profile 902 and FIG. 11, from time=0 to time $t_1$, shutter 208 can be moved along horizontal direction 208M by motion mechanism 212 to expose outlet 205's edge portion 205A to chamber 202 (shown in FIG. 10) with the entire chuck 210 being substantially shielded from outlet 205 by shutter 208. In some embodiments, at time $t_1$, shutter 208's edge portion 208A can be vertically (e.g., in the z-direction) above chuck 210's edge portion 210L or vertically (e.g., in the z-direction) above substrate 201's first portion.

Figure 12:
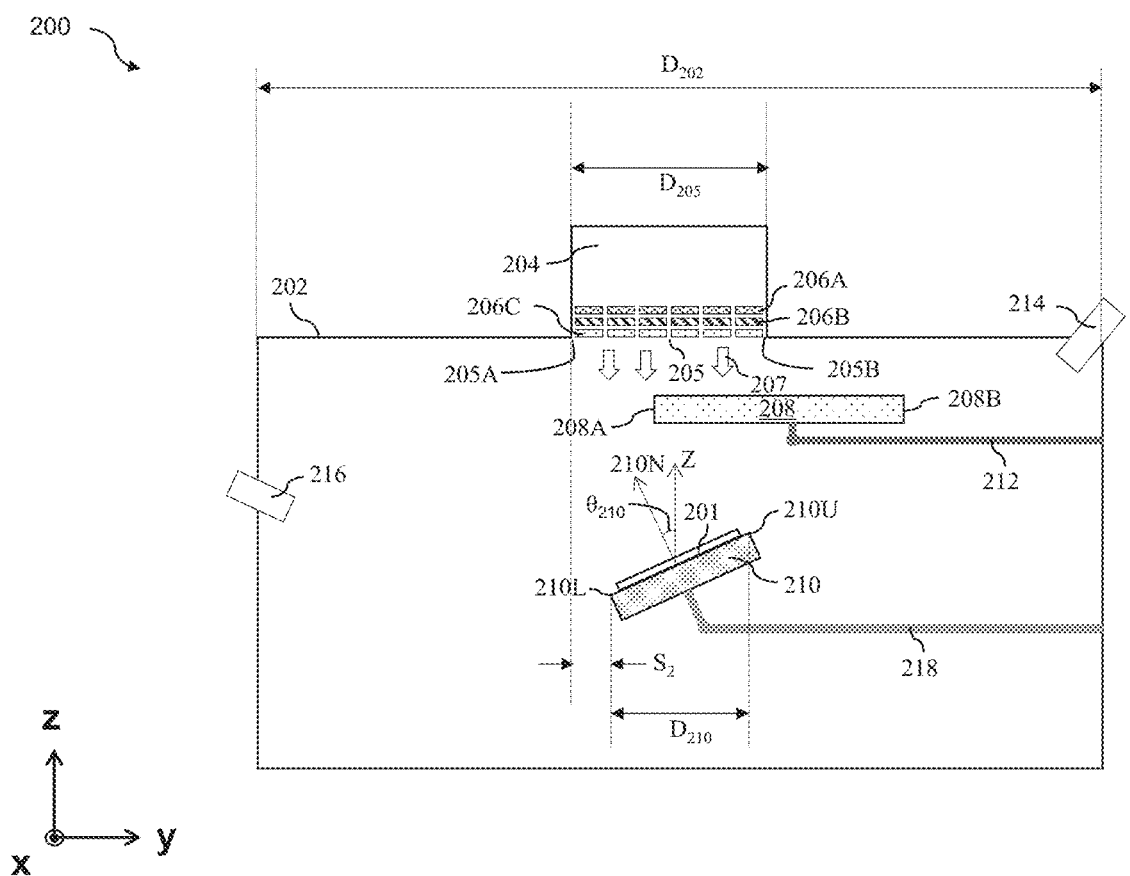

Referring to FIG. 9's profile 902 and FIG. 12, between time $t_1$ and time $t_2$, shutter 208 can be further moved along horizontal direction 208M to expose substrate 201's first portion (e.g., proximate to chuck 210's edge portion 210L) to outlet 205 and shield substrate 201's second portion (e.g., proximate to chuck 210's edge portion 210U). Namely, portions of substrate 201 proximate to chuck 210's edge portion 210L can start receiving irradiation $I_6$ (shown in FIG. 8's profile 804) from particle beams 207, while portions of substrate 201 proximate to chuck 210's edge portion 210U can be blocked from receiving irradiation $I_6$ by shutter 208. Accordingly, during an interval between time $t_1$ and time $t_2$, the exposure time duration of portions of substrate 201 proximate to chuck 210's edge portion 210L can be greater than the exposure time duration of portions of substrate 201 proximate to chuck 210's edge portion 210U, thus rendering exposure time duration $EXP_2$ shown in FIG. 8's profile 806.

In some embodiments, between time $t_1$ and time $t_2$, shutter 208's edge portion 208A can be vertically (e.g., in the z-direction) above chuck 210 and horizontally (e.g., in the y-direction or in horizontal direction 208M) between chuck 210's edge portions 210L and 210U. In some embodiments, between time $t_1$ and time $t_2$, shutter 208's edge portion 208A can be vertically (e.g., in the z-direction) under outlet 205 and horizontally (e.g., in the y-direction or in horizontal direction 208M) moved from a first portion of chamber 202 proximate to outlet 205's edge portion 205A to a second portion of chamber 202 proximate to outlet 205's edge portion 205B. In some embodiments, between time $t_1$ and time $t_2$, shutter 208 can be moved along horizontal direction 208M with a velocity $V_{208}$ (shown in FIG. 9's profile 902) based on acute angle $\theta_{210}$. For example, velocity $V_{208}$ can be reduced in response to an increasing of acute angle $\theta_{210}$, because the increased acute angle $\theta_{210}$ can result in a greater discrepancy of irradiance $I_6$ received between substrate 201's first portion and substrate 201's second portion, thus requiring a reduced velocity $V_{208}$ to provide a longer exposure time duration proximate to substrate 201's first portion. In some embodiments, between time $t_1$ and time $t_2$, velocity $V_{208}$ can be a substantially constant velocity. In some embodiments, between time $t_1$ and time $t_2$, velocity $V_{208}$ can have a greater velocity proximate to time $t_1$ than proximate to time $t_2$ (e.g., shutter 208 can be decelerated from time $t_1$ to time $t_2$). In some embodiments, between time $t_1$ and time $t_2$, velocity $V_{208}$ can have a less velocity proximate to time $t_1$ than proximate to time $t_2$ (e.g., shutter 208 is accelerated between time $t_1$ and time $t_2$). In some embodiments, between time $t_1$ and time $t_2$, velocity $V_{208}$ can be a stepwise velocity that can include multiple substantially constant velocities between time $t_1$ and time $t_2$.

Figure 13:
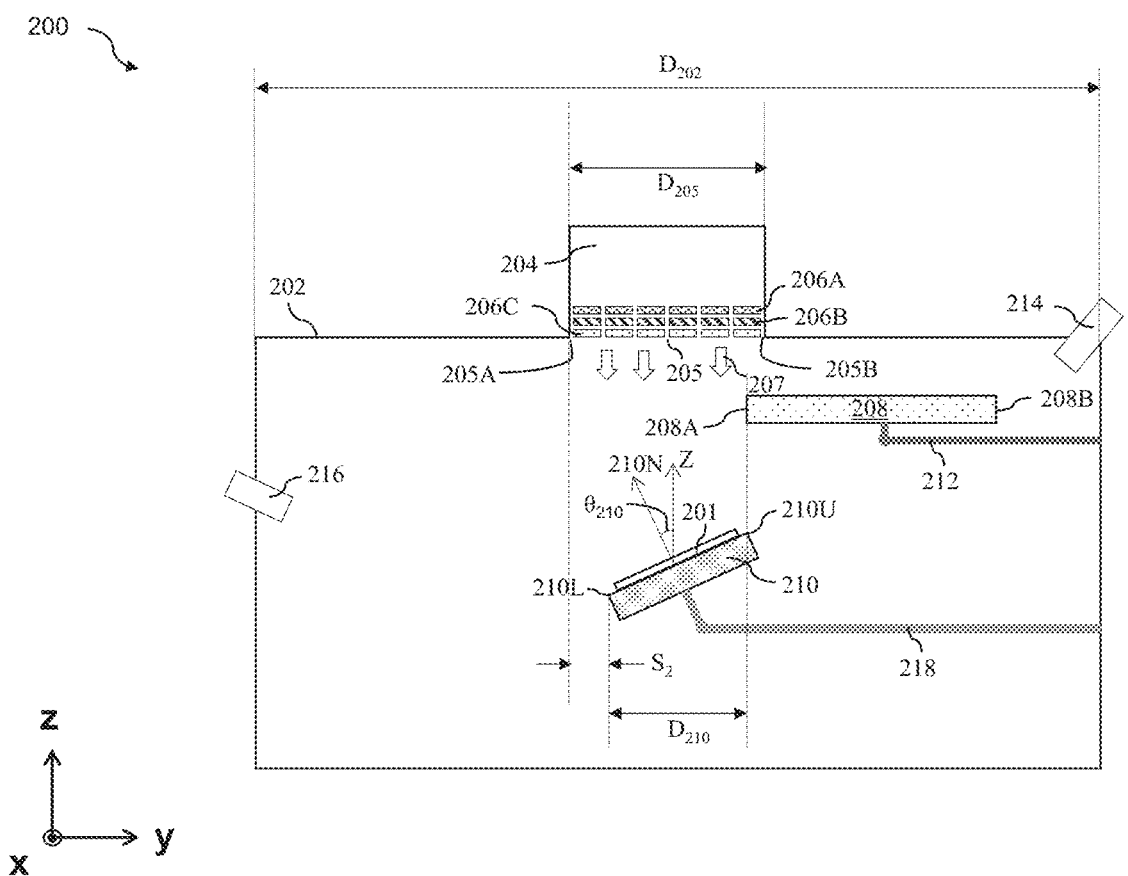
Figure 14:
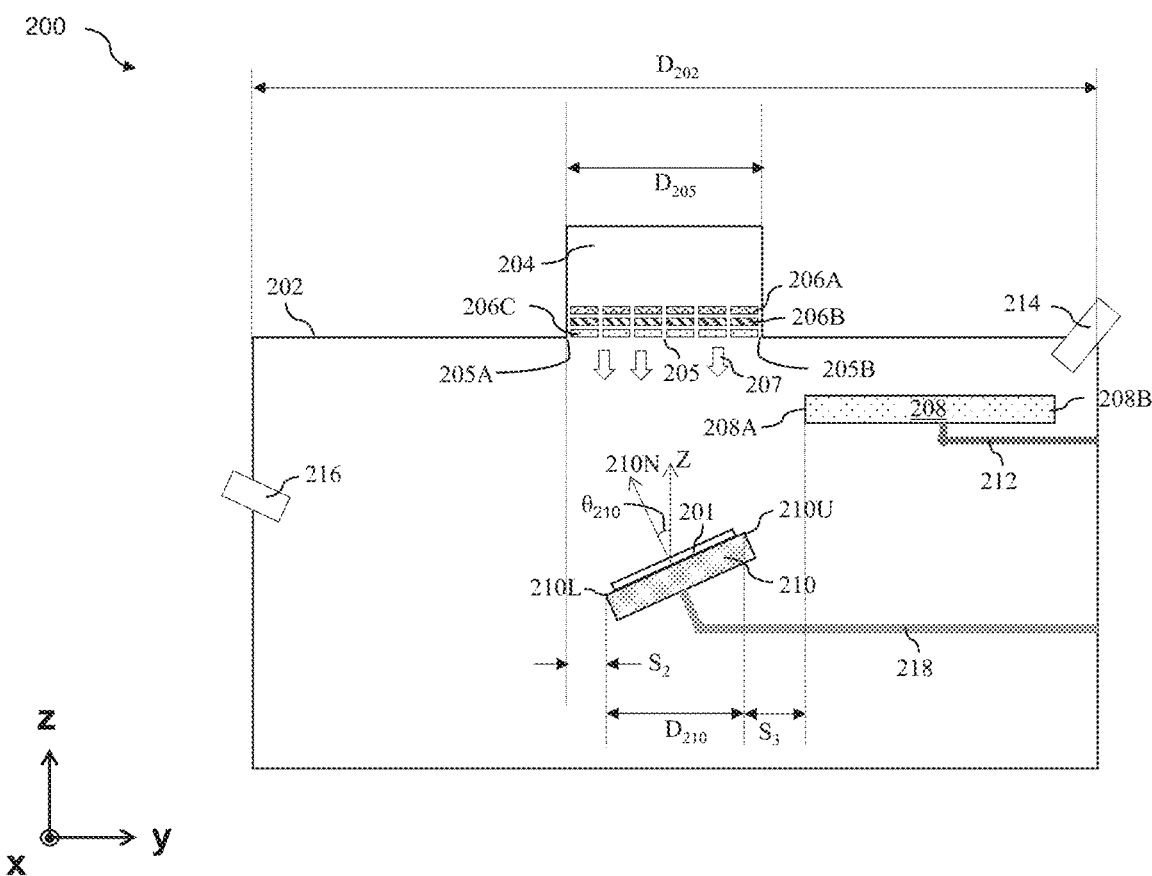
Figure 15:
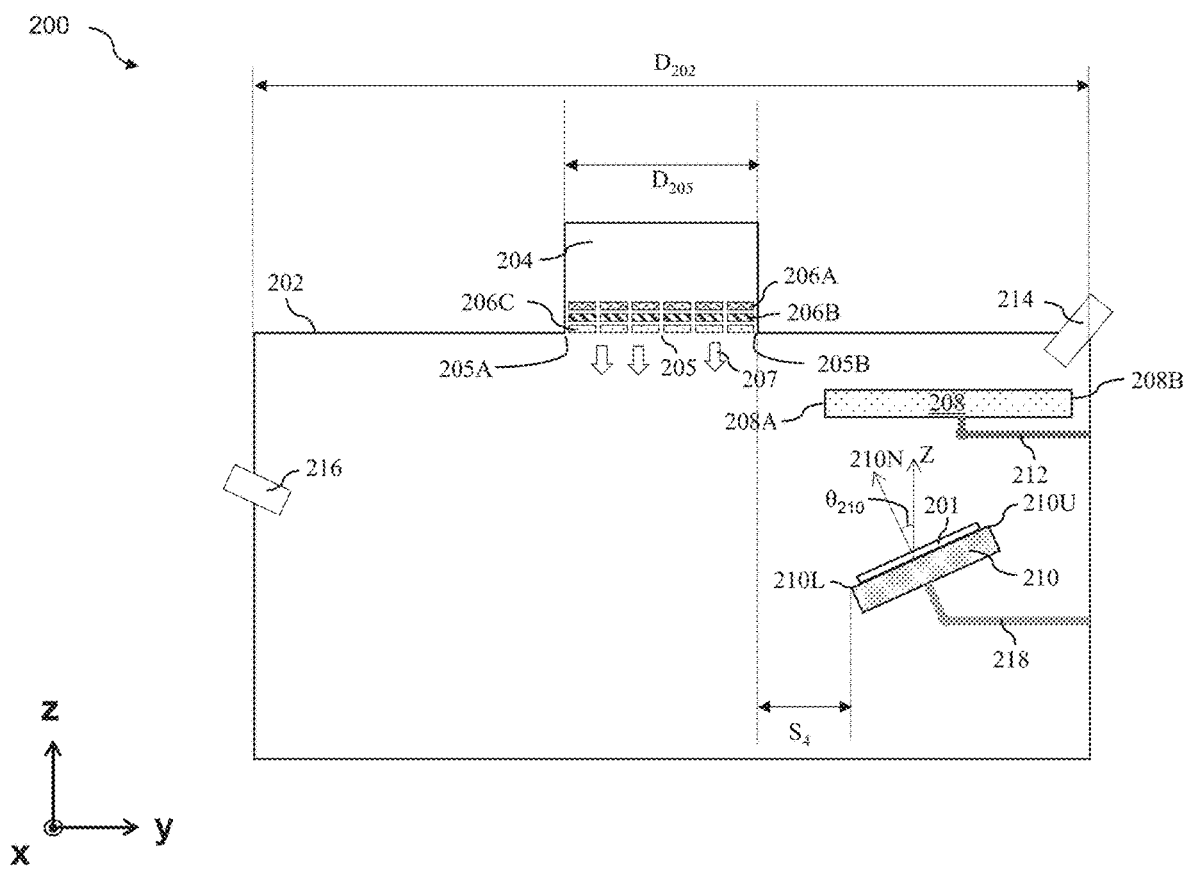

Referring to FIG. 9's profile 902 and FIGS. 13 and 14, from time=$t_2$ to time $t_3$, shutter 208 can be further moved along horizontal direction 208M by motion mechanism 212 to expose the entire substrate to outlet 205 to receive particle beams 207. In some embodiments, at time $t_2$, shutter 208's edge portion 208A can be vertically (e.g., in the z-direction) above chuck 210's edge portion 210U (shown in FIG. 13). In some embodiments, at time $t_3$, shutter 208's edge portion 208A can be horizontally (e.g., in the y-direction or in horizontal direction 208M) separated from chuck 210's edge portion 210U by a suitable horizontal (e.g., in the y-direction or in horizontal direction 208M) separation $S_3$ (shown in FIG. 14), such as from about 0.1 inches to about 5 inches, to ensure the entire substrate 201 receives particle beams 207 from ion source 204. In some embodiments, to ensure chamber 202 having enough space to accommodate the above-noted separation $S_3$, Chamber 202's horizontal dimension $D_{202}$ can be greater than the sum of outlet 205's horizontal dimension $D_{205}$ and shutter 208's horizontal dimension $D_{208}$. In some embodiments, between time $t_2$ and time $t_3$, shutter 208 can be moved along horizontal direction 208M with a velocity substantially equal to velocity $V_{208}$.

Figure 19:
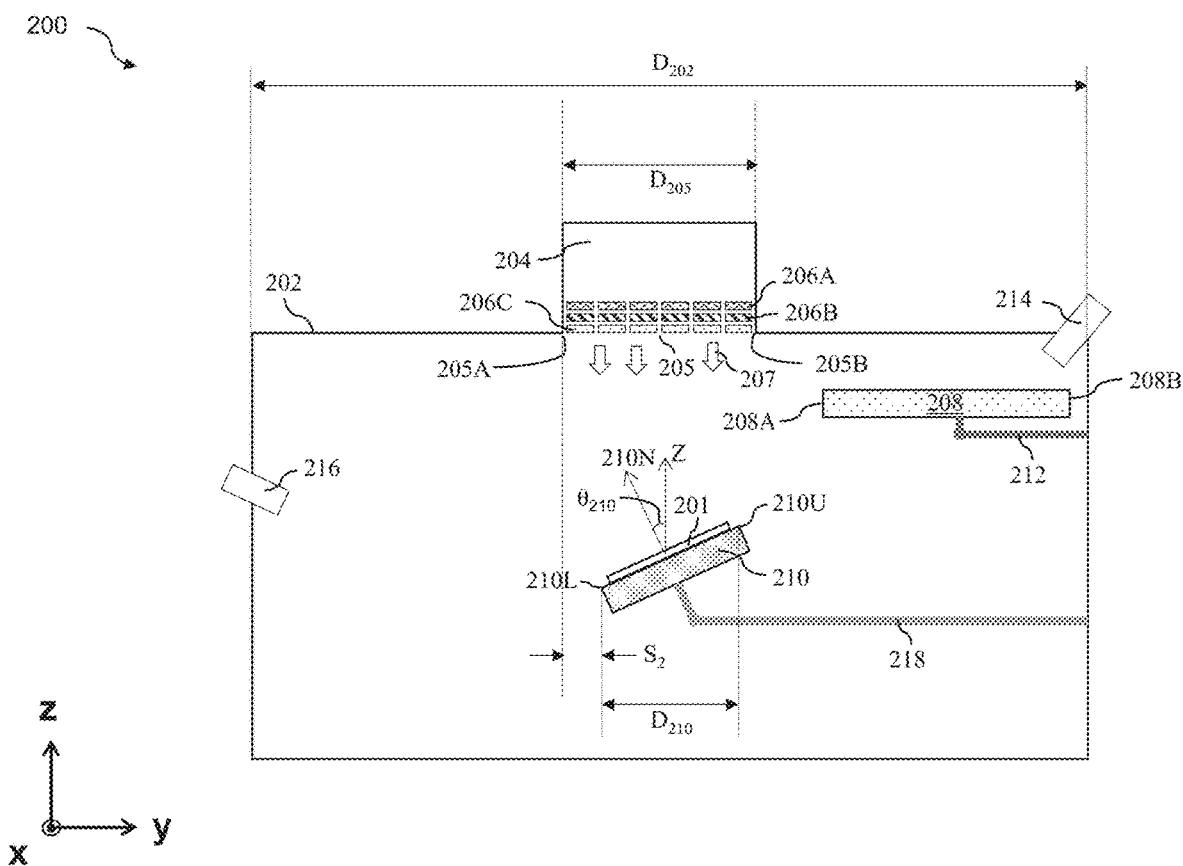

Referring to FIG. 9's profile 902 and FIGS. 14 and 19, from time=$t_3$ to time $t_4$, shutter 208 can be static to allow particle beams 207 irradiating the entire substrate 201. For example, as shown in FIG. 14, shutter 208 can be static and horizontally (e.g., in the y-direction or in horizontal direction 208M) separated from chuck 210's edge portion 210U by separation $S_3$. Time $t_4$ can be separated from time $t_3$ with any suitable time duration, such as from about 0.1 seconds to about 100 seconds, for ion source 204 to sufficiently irradiate the entire substrate 201. In some embodiments, time $t_3$ and time $t_4$ can be substantially identical to each other. In some embodiments, as shown in FIG. 20, substrate 201, which is tilted with respect to outlet 205 of acute angle $\theta_{210}$, can receive a substantially spatially-uniform radiant exposure $J_0$ (shown in FIG. 8's profile 808) at time $t_4$ (shown in FIG. 9's profile 902) to form substantially identical lateral etching depth $S_L$ proximate to opening 201L (e.g., located at substrate 201's first portion; proximate to chuck 210's edge portion 210L) and proximate to opening 201U (e.g., located at substrate 201's second portion; proximate to chuck 210's edge portion 210U).

In some embodiments, after time $t_4$, substrate 201's orientation can be adjusted by chuck 210, and the above-discussed irradiation process from time=0 to time $t_4$ can be repeatedly performed on substrate 201 with the adjusted orientation. For example, after time $t_4$, the process of irradiating substrate 201, configured with the variable shutter exposure mode, can further include (i) deactivating ion source 204 to stop outputting particle beams 207, (ii) locating shutter 208 vertically (e.g., in the z-direction) under outlet 205 and horizontally (e.g., in the x-y plane) extending beyond outlet 205's perimeter (restoring shutter 208's position according to FIG. 10) while ion source 204 can be deactivated, (iii) rotating chuck 210 on substrate 201's normal 210N with any suitable angle, such as about 180 degrees, to adjust substrate 201's orientation, and (iv) activating ion source 204 to output particle beams 207 and moving shutter 208 along horizontal direction 208M to repeat the above-discussed irradiation processes from time=0 to time $t_4$ on substrate 201 with the adjusted orientation. Accordingly, in some embodiments, as shown in FIG. 21, substrate 201, which is tilted with respect to outlet 205 of acute angle $\theta_{210}$, can receive a substantially spatially-uniform radiant exposure $J_0$ (shown in FIG. 8's profile 808) to laterally etch device layer 201B and/or mask layer 201C with lateral etching depth $S_R$ proximate to opening 201L and proximate to opening 201U. In some embodiments, substrate 201's orientation can be fixed on chuck 210 while shutter 208 is moved along horizontal direction 208M (e.g., chuck 210 does not rotate while shutter 208 is moving). In some embodiments, chuck 210 can be rotated to adjust substrate 201's orientation while ion source 204 being deactivated. In some embodiments, chuck 210 can be rotated to adjust substrate 201's orientation while ion source 204 being activated and shutter 208 being located between ion source 204 and chuck 210 to shield chuck 210 from particle beams 207 outputted from outlet 205.

In some embodiments, after time $t_4$, shutter 208 can be reversely moved back along an opposite horizontal direction, such as along the opposite of horizontal direction 208M (e.g., towards FIG. 5's left), to gradually shield substrate 201 from substrate 201's second portion (e.g., opening 201U) to substrate 201's first portion (e.g., opening 201L) while ion source 204 can be activated to output particle beams 207. Accordingly, the irradiation processes on substrate 201 from time $t_1$ to time $t_3$ can be similarly repeated from time $t_4$ to time $t_6$ with shutter 208 being moved along the opposite of horizontal direction 208M (e.g., towards FIG. 5's left). For example, the operation at time $t_5$ can correspond to the operation at time $t_2$, which can be represented by FIG. 13. Similarly, the operation between time $t_5$ and time $t_6$ can correspond to the operation between time $t_2$ and time $t_1$, which can be represented by FIG. 12. The operation at time $t_6$ can correspond to the operation at time $t_1$, which can be represented by FIG. 11. In some embodiments, as shown in FIG. 20, substrate 201 can receive a substantially spatially-uniform radiant exposure $J_0$ (shown in FIG. 8's profile 808) at time $t_6$ to form substantially identical lateral etching depth $S_L$ proximate to opening 201L (e.g., located at substrate 201's first portion; proximate to chuck 210's edge portion 210L) and proximate to opening 201U (e.g., located at substrate 201's second portion; proximate to chuck 210's edge portion 210U).

In some embodiments, referring to FIG. 5, FIG. 9's profile 904, and FIGS. 15-20, the process of irradiating substrate 201 with the spatial-dependent exposure time duration (e.g., exposure time duration $EXP_2$) can be operated by moving chuck 210 to gradually expose substrate 201 to outlet 205 with ion source 204 being activated to output particle beams 207 through outlet 205 (e.g., variable chuck exposure mode). For example, the process of irradiating substrate 201 with the spatial-dependent exposure time duration, configured with a variable chuck exposure mode, can include locating shutter 208 horizontally (e.g., in the x-y plane) outside outlet 205's perimeter (shown in FIG. 15) by motion mechanism 212 to expose outlet 205 to chamber 202. In some embodiments, shutter 208 can be located by motion mechanism 212 to expose outlet 205's edge portions 205A and 205B to chamber 202. The process of irradiating substrate 201, configured with the variable chuck exposure mode, can further include locating chuck 210 horizontally (e.g., in the x-y plane) outside outlet 205's perimeter (shown in FIG. 15) by motion mechanism 218. For example, chuck 210's edge portion 210L can be horizontally (e.g., in the y-direction or in horizontal direction 210M) separated from outlet 205's edge portion 205B by a suitable horizontal (e.g., in the y-direction or in horizontal direction 210M) separation $S_4$ (shown in FIG. 15), such as from about 0.1 inches to about 5 inches, to prevent the entire substrate 201 from receiving particle beams 207 from ion source 204. In some embodiments, separation $S_4$ can be determined based on irradiance $I_0$ at outlet 205. For example, in response to an increase irradiance $I_0$, separation $S_4$ can be increased to prevent substrate 201 from receiving irradiance $I_0$'s straggle. In some embodiments, a horizontal (e.g., in the y-direction) separation between shutter 208's edge portion 208A and outlet 205's edge portion 205B can be less than or substantially equal to separation $S_4$ to block substrate 201 from receiving irradiance $I_0$'s straggle. In some embodiments, to ensure chamber 202 having enough space to accommodate the above-noted separation $S_4$, Chamber 202's horizontal dimension $D_{202}$ can be greater than the sum of outlet 205's horizontal dimension $D_{205}$ and chuck 210's horizontally projected dimension $D_{210}$. The process of irradiating substrate 201, configured with the variable chuck exposure mode, can further include moving chuck 210 along horizontal direction 210M (shown in FIG. 5; towards FIG. 5's left) to gradually expose substrate 201 from substrate 201's first portion (e.g., opening 201L) to substrate 201's second portion (e.g., opening 201U) with reference to FIGS. 9 and 15-20. In some embodiments, shutter 208 can be static while chuck 210 is moved along horizontal direction 210M.

Figure 16:
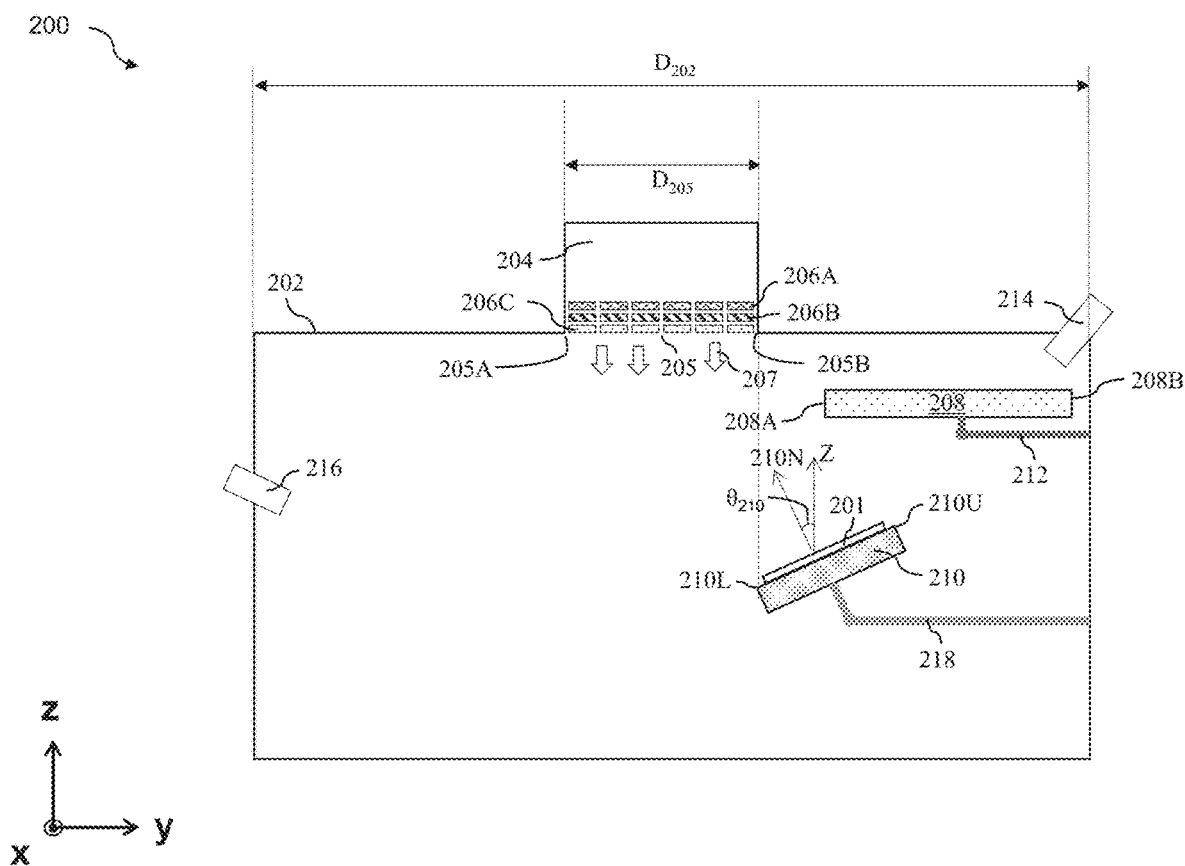

For example, referring to FIG. 9's profile 904 and FIG. 16, from time=0 to time $t_7$, chuck 210 can be moved along horizontal direction 210M by motion mechanism 218 to expose chuck 210's edge portion 210L to outlet 205 (shown in FIG. 16) with chuck 210 being substantially non-vertically-overlapped with outlet 205. In some embodiments, at time $t_7$, substrate 201's first portion (proximate to chuck 210's edge portion 210L) and substrate 201's second portion (proximate to chuck 210's edge portion 210U) can be horizontally (e.g., in the y-direction; or in horizontal direction 210M) non-overlapped with outlet 205.

Figure 17:
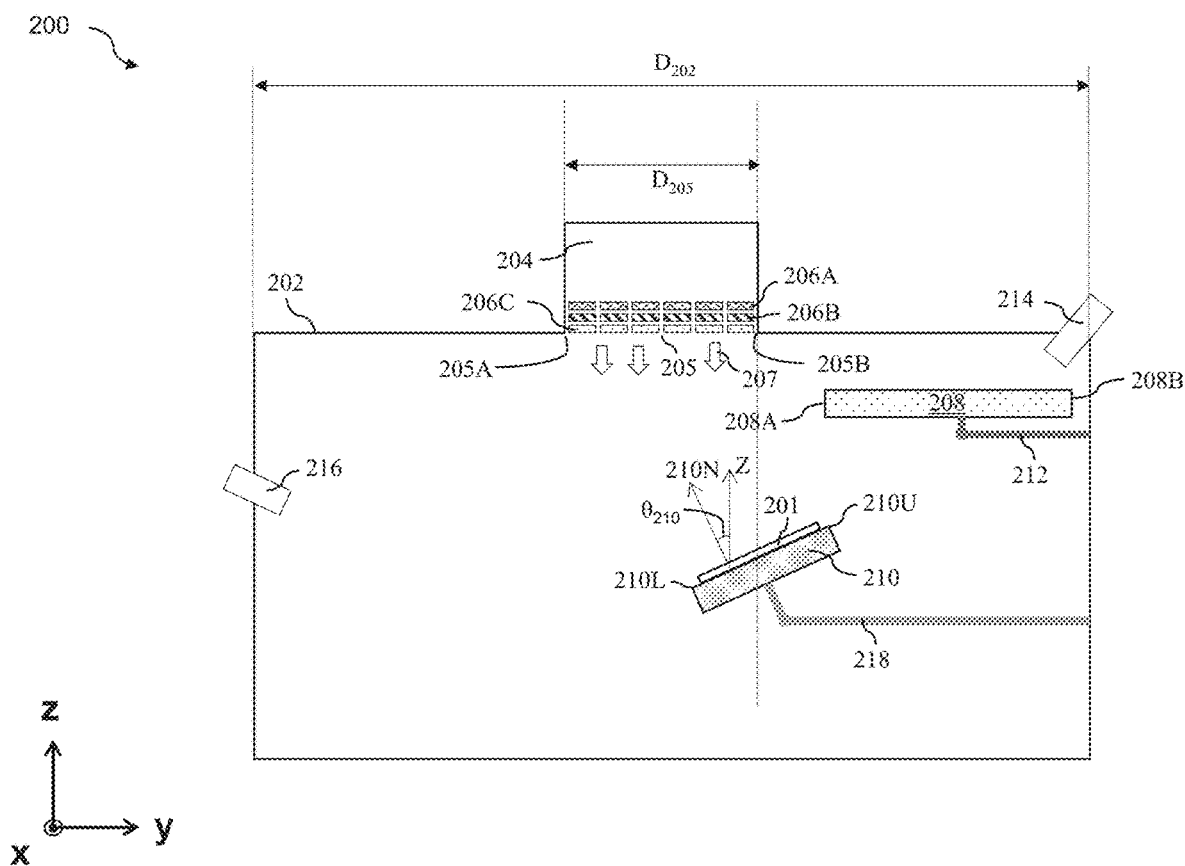

Referring to FIG. 9's profile 904 and FIG. 17, between time $t_7$ and time $t_8$, chuck 210 can be further moved along horizontal direction 210M to vertically (e.g., in the z-direction) overlap substrate 201's first portion (e.g., proximate to chuck 210's edge portion 210L) with outlet 205 while substrate 201's second portion (e.g., proximate to chuck 210's edge portion 210U) can be vertically (e.g., in the z-direction) non-overlapped with outlet 205. Accordingly, portions of substrate 201 proximate to chuck 210's edge portion 210L can start receiving irradiation $I_6$ (shown in FIG. 8's profile 804) from particle beams 207, while portions of substrate 201 proximate to chuck 210's edge portion 210U can receive a negligible irradiation (e.g., close to zero irradiation) from particle beams 207. Namely, during an interval between time $t_7$ and time $t_8$, the exposure time duration of portions of substrate 201 proximate to chuck 210's edge portion 210L can be greater than the exposure time duration of portions of substrate 201 proximate to chuck 210's edge portion 210U, thus rendering exposure time duration $EXP_2$ shown in FIG. 8's profile 806. In some embodiments, between time $t_7$ and time $t_8$, chuck 210's edge portion 210L can be vertically (e.g., in the z-direction) under outlet 205 and horizontally (e.g., in the y-direction or in horizontal direction 210M) between outlet 205's edge portions 205A and 205B. In some embodiments, between time $t_7$ and time $t_8$, chuck 210's edge portion 210L can be vertically (e.g., in the z-direction) under outlet 205 and horizontally (e.g., in the y-direction or in horizontal direction 208M) moved from a first portion of chamber 202 proximate to outlet 205's edge portion 205B to a second portion of chamber 202 proximate to outlet 205's edge portion 205A. In some embodiments, between time $t_7$ and time $t_8$, chuck 210 can be moved along horizontal direction 210M with a velocity $V_{210}$ (shown in FIG. 9's profile 904) based on acute angle $\theta_{210}$. For example, velocity $V_{210}$ can be reduced in response to an increasing of acute angle $\theta_{210}$, because the increased acute angle $\theta_{210}$ can result in a greater discrepancy of irradiance $I_6$ received between substrate 201's first portion and substrate 201's second portion, thus requiring a reduced velocity $V_{210}$ to provide a longer exposure time duration proximate to substrate 201's first portion. In some embodiments, between time $t_7$ and time $t_8$, velocity $V_{210}$ can be a substantially constant velocity. In some embodiments, between time $t_7$ and time $t_8$, velocity $V_{210}$ can have a greater velocity proximate to time $t_7$ than proximate to time $t_8$ (e.g., chuck 210 can be decelerated from time $t_7$ and time $t_8$). In some embodiments, between time $t_7$ and time $t_8$, velocity $V_{210}$ can have a less velocity proximate to time $t_7$ than proximate to time $t_8$ (e.g., chuck 210 can be accelerated from time $t_7$ and time $t_8$). In some embodiments, between time $t_7$ and time $t_8$, velocity $V_{210}$ can be a stepwise velocity that can include multiple substantially constant velocities between time $t_1$ and time $t_2$.

Figure 18:
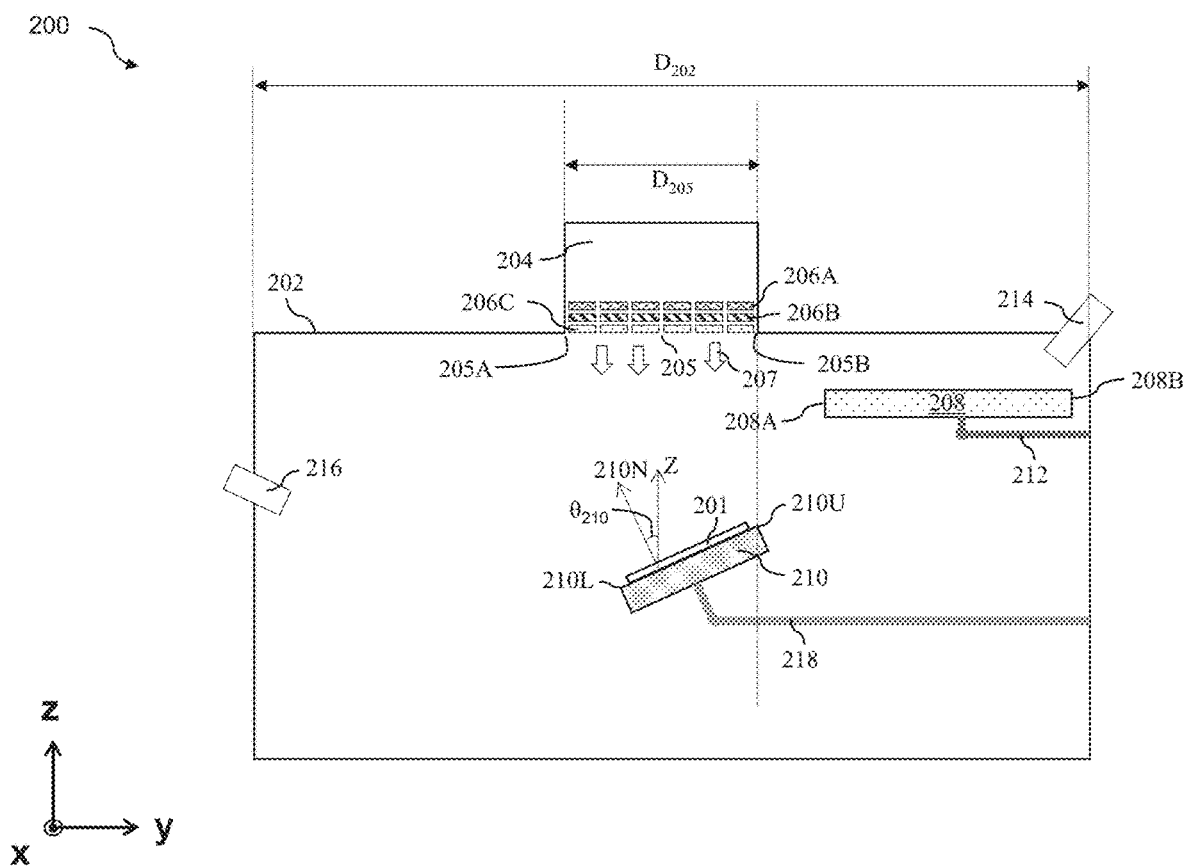

Referring to FIG. 9's profile 904 and FIGS. 18 and 19, from time=$t_8$ to time $t_9$, chuck 210 can be further moved along horizontal direction 210M by motion mechanism 218 to expose the entire substrate 201 to outlet 205 to receive particle beams 207. In some embodiments, at time $t_8$, chuck 210's edge portion 210U can be vertically (e.g., in the z-direction) overlapped with outlet 205's edge portion 205B (shown in FIG. 18). In some embodiments, between time $t_8$ and time $t_9$, shutter 208's edge portion 208A can be further moved along horizontal direction 210M to reduce a horizontal (e.g., in the y-direction or in horizontal direction 210M) separation between chuck 210's edge portion 210L and outlet 205's edge portion 205A to ensure the entire substrate 201 receives particle beams 207 from ion source 204. In some embodiments, at time $t_9$, chuck 210's edge portion 210L can be horizontally (e.g., in the y-direction or in horizontal direction 210M) separated from outlet 205's edge portion 205A by at least separation $S_2$ (shown in FIG. 19), such as from about 0.1 inches to about 4 inches, to ensure the entire substrate 201 receives particle beams 207 from ion source 204. In some embodiments, at time $t_9$, chuck 210's edge portion 210U can be horizontally (e.g., in the y-direction or in horizontal direction 210M separated from outlet 205's edge portion 205B by at least separation $S_2$ (not shown in FIG. 19) to ensure the entire substrate 201 receives particle beams 207 from ion source 204. In some embodiments, between time $t_8$ and time $t_9$, chuck 210 can be moved along horizontal direction 210M with a velocity substantially equal to velocity $V_{210}$.

Referring to 9's profile 904 and FIGS. 14 and 19, from time=$t_9$ to time $t_{10}$, chuck 210 can be static to allow particle beams 207 irradiating the entire substrate 201. For example, as shown in FIG. 19, chuck 210 can be static and horizontally (e.g., in the y-direction or in horizontal direction 210M) between chuck 210's edge portions 210L and 210U to receive particle beams 207. Time $t_{10}$ can be separated from time to with any suitable time duration, such as from about 0.1 seconds to about 100 seconds, for ion source 204 to sufficiently irradiate the entire substrate 201. In some embodiments, time $t_0$ and time $t_{10}$ can be substantially identical to each other. In some embodiments, as shown in FIG. 20, substrate 201, which is tilted with respect to outlet 205 of acute angle $\theta_{210}$, can receive a substantially spatially-uniform radiant exposure $J_0$ (shown in FIG. 8's profile 808) at time $t_{10}$ (shown in FIG. 9's profile 904) to form substantially identical lateral etching depth $S_1$, proximate to opening 201L (e.g., located at substrate 201's first portion; proximate to chuck 210's edge portion 210L) and proximate to opening 201U (e.g., located at substrate 201's second portion; proximate to chuck 210's edge portion 210U).

In some embodiments, after time $t_{10}$, substrate 201's orientation can be adjusted by chuck 210, and the above-discussed irradiation process from time=0 to time $t_{10}$ can be repeatedly performed on substrate 201 with the adjusted orientation. For example, after time $t_{10}$, the process of irradiating substrate 201, configured with the variable chuck exposure mode, can further include (i) deactivating ion source 204 to stop outputting particle beams 207, (ii) locating chuck 210 horizontally (e.g., in the x-y plane) outside outlet 205's perimeter (restoring chuck 210's position according to FIG. 15) while ion source 204 being deactivated, (iii) rotating chuck 210 on substrate 201's normal 210N with any suitable angle, such as about 180 degrees, to adjust substrate 201's orientation, and (iv) activating ion source 204 to output particle beams 207 and moving chuck 210 along horizontal direction 210M to repeat the above-discussed irradiation processes from time=0 to time $t_{10}$ on substrate 201 with the adjusted orientation. Accordingly, in some embodiments, as shown in FIG. 21, substrate 201, which is tilted with respect to outlet 205 of acute angle $\theta_{210}$, can receive a substantially spatially-uniform radiant exposure $J_0$ (shown in FIG. 8's profile 808) to laterally etch device layer 201B and/or mask layer 201C with lateral etching depth $S_R$ proximate to opening 201L and proximate to opening 201U. In some embodiments, substrate 201's orientation can be fixed on chuck 210 while chuck 210 can be moved along horizontal direction 210M (e.g., chuck 210 does not rotate while chuck 210 is moving). In some embodiments, chuck 210 can be rotated to adjust substrate 201's orientation while ion source 204 can be deactivated. In some embodiments, chuck 210 can be rotated to adjust substrate 201's orientation while ion source 204 can be activated and shutter 208 can be located between ion source 204 and chuck 210 to shield chuck 210 from particle beams 207 outputted from outlet 205.

In some embodiments, after time $t_{10}$, chuck 210 can be reversely moved back along the opposite of horizontal direction 210M (e.g., towards FIG. 5's right) to gradually shield substrate 201 from substrate 201's second portion (e.g., opening 201U) to substrate 201's first portion (e.g., opening 201L) while ion source 204 can be activated to output particle beams 207. Accordingly, the irradiation processes on substrate 201 from time $t_7$ to time $t_9$ can be similarly repeated from time $t_{10}$ to time $t_{12}$ with chuck 210 being moved along the opposite of horizontal direction 210M (e.g., towards FIG. 5's right). For example, the operation at time $t_{11}$ can correspond to the operation at time $t_8$, which can be represented by FIG. 18. Similarly, the operation between time $t_{11}$ and time $t_{12}$ can correspond to the operation between time $t_7$ and time $t_8$, which can be represented by FIG. 17. The operation at time $t_{12}$ can correspond to the operation at time $t_7$, which can be represented by FIG. 16. In some embodiments, as shown in FIG. 20, substrate 201 can receive a substantially spatially-uniform radiant exposure $J_0$ (shown in FIG. 8's profile 808) at time $t_{12}$ to form substantially identical lateral etching depth $S_L$ proximate to opening 201L (e.g., located at substrate 201's first portion, proximate to chuck 210's edge portion 210L) and proximate to opening 201U (e.g., located at substrate 201's second portion; proximate to chuck 210's edge portion 210U).

In some embodiments, the process of irradiating substrate 201 configured with the variable chuck exposure mode can be concurrently performed with the process of irradiating substrate 201 configured with the variable shutter exposure mode to irradiate substrate 201 with the spatial-dependent exposure time duration (e.g., exposure time duration $EXP_2$).

Referring to FIG. 6, in operation 640, the substrate is transferred from the processing module to the transfer module. For example, referring to FIG. 2, substrate 201 can be transferred from processing module 200 to hub 104. Substrate 201 can be further transferred from hub 104 to transfer module 105. Substrate 201 can be further transferred from hub 104 to loading port 107. The above-noted substrate transferring operation can include opening/closing valve 140 and instructing robotic arms robotic art 113) to retrieve and deliver substrate 201. The above-noted substrate transferring operation can further include matching vacuum level between processing module 102 and hub 104, matching vacuum level between hub 104 and transfer module 105, and/or matching vacuum level between transfer module 105 and loading port 107 by instructing gas supply system 109 and gas extraction system 110. Other methods of transferring substrate 201 are within the scope and spirits of this disclosure.

Figure 22:
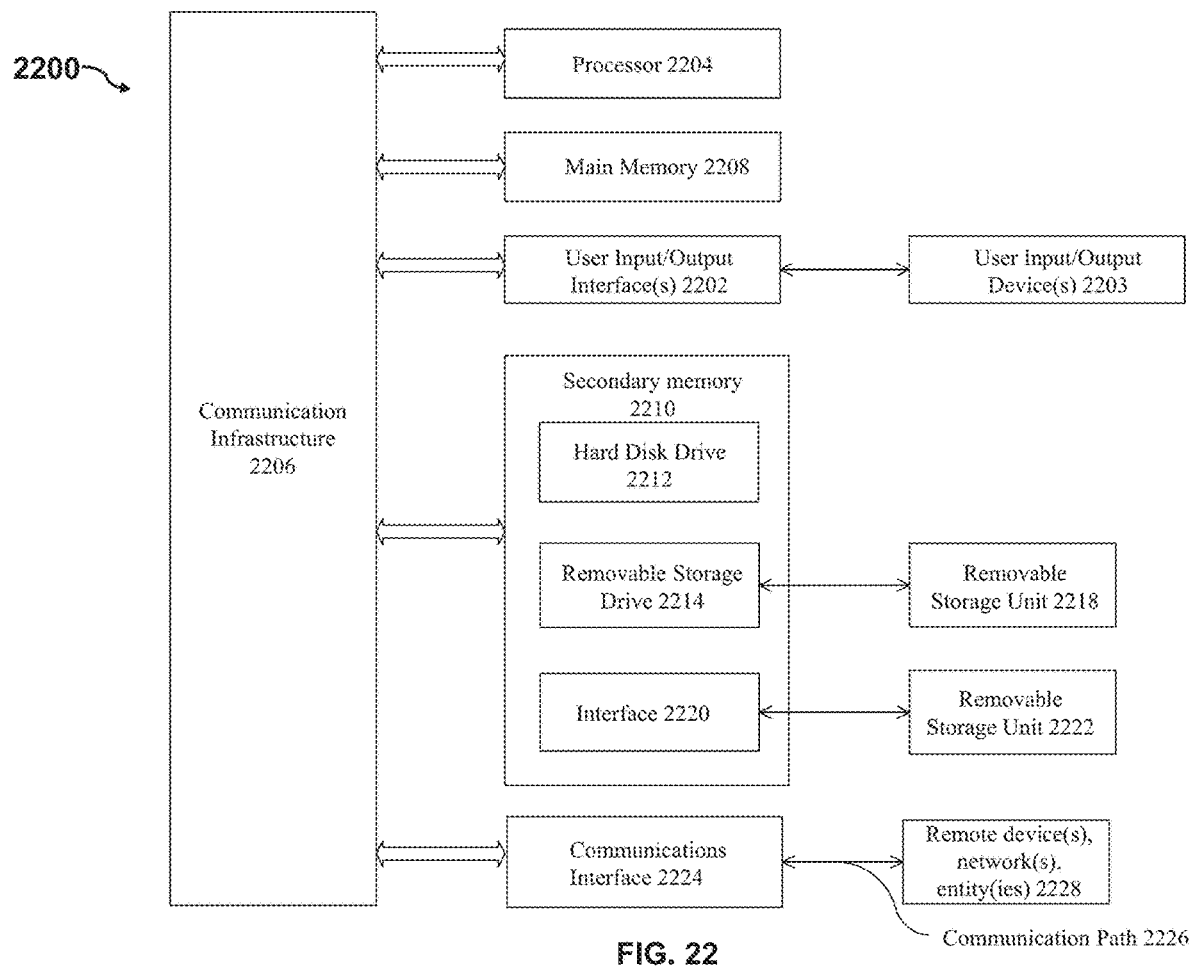
FIG. 22 illustrates a computer system, according to some embodiments.

FIG. 22 is an illustration of a computer system 2200 in which various embodiments of the present disclosure can be implemented, according to some embodiments. Computer system 2200 can be used, for example, in controller system 124 of FIG. 1. Computer system 2200 can be any well-known computer capable of performing the functions and operations described herein. For example, and without limitation, computer system 2200 can be capable of processing and transmitting signals. Computer system 2200 can be used, for example, to execute one or more operations of semiconductor device manufacturing system 100 and/or method 600.

Computer system 2200 includes one or more processors (also called central processing units, or CPUs), such as a processor 2204. Processor 2204 is connected to a communication infrastructure or bus 2206. Computer system 2200 also includes input/output device(s) 2203, such as monitors, keyboards, pointing devices, etc., that communicate with communication infrastructure or bus 2206 through input/output interface(s) 2202. A control tool can receive instructions to implement functions and operations described herein—e.g., the functions of semiconductor device manufacturing system 100 described in FIG. 1 and the method/process described in FIG. 6—via input/output device(s) 2203. Computer system 2200 also includes a main or primary memory 2208, such as random access memory (RAM). Main memory 2208 can include one or more levels of cache. Main memory 2208 has stored therein control logic (e.g., computer software) and/or data. In some embodiments, the control logic (e.g., computer software) and/or data can include one or more of the functions described above with respect to semiconductor device manufacturing system 100. In some embodiments, processor 2204 can be configured to execute the control logic stored in main memory 2208.

Computer system 2200 can also include one or more secondary storage devices or memory 2210. Secondary memory 2210 can include, for example, a hard disk drive 2212 and/or a removable storage device or drive 2214. Removable storage drive 2214 can be a floppy disk drive, a magnetic tape drive, a compact disk drive, an optical storage device, tape backup device, and/or any other storage device/drive.

Removable storage drive 2214 can interact with a removable storage unit 2218. Removable storage unit 2218 includes a computer usable or readable storage device with computer software (control logic) and/or data stored thereon. Removable storage unit 2218 can be a floppy disk, magnetic tape, compact disk, DVD, optical storage disk, and/any other computer data storage device. Removable storage drive 2214 reads from and/or writes to removable storage unit 2218 in a well-known manner.

According to some embodiments, secondary memory 2210 can include other mechanisms, instrumentalities or other approaches for allowing computer programs and/or other instructions and/or data to be accessed by computer system 2200. Such mechanisms, instrumentalities or other approaches can include, for example, a removable storage unit 2222 and an interface 2220. Examples of the removable storage unit 2222 and the interface 2220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 2210, removable storage unit 2218, and/or removable storage unit 2222 can include one or more of the functions described above with respect to the wet bench structure.

Computer system 2200 can further include a communication or network interface 2224. Communication interface 2224 enables computer system 2200 to communicate and interact with any combination of remote devices, remote networks, remote entities, etc. (individually and collectively referenced by reference number 2228). For example, communication interface 2224 can allow computer system 2200 to communicate with remote devices 2228 over communications path 2226, which can be wired and/or wireless, and which can include any combination of LANs, WANs, the Internet, etc. Control logic and/or data can be transmitted to and from computer system 2200 via communication path 2226.

The functions/operations in the preceding embodiments can be implemented in a wide variety of configurations and architectures. Therefore, some or all of the operations in the preceding embodiments—e.g., the functions of semiconductor device manufacturing system 100 described in FIG. 1 and the methods/processes described in FIG. 6—can be performed in hardware, in software or both. In some embodiments, a tangible apparatus or article of manufacture including a tangible computer useable or readable medium with control logic (software) stored thereon is also referred to herein as a computer program product or program storage device. This includes, but is not limited to, computer system 2200, main memory 2208, secondary memory 2210 and removable storage units 2218 and 2222, as well as tangible articles of manufacture embodying any combination of the foregoing. Such control logic, when executed by one or more data processing devices (such as computer system 2200), causes such data processing devices to operate as described herein. For example, the hardware/equipment can be connected to or be part of element 2228 (remote device(s), network(s), entity(ies) 2228) of computer system 2200.

The present disclosure provides a particle beam apparatus and a method for a particle beam process. The particle beam apparatus can be a dry etching apparatus, and the method can be an ion beam etching process. The ion beam etching process can be an elongation process by tilting the target substrate's normal with respect to the outlet of the particle beam apparatus's ion source. The particle beam apparatus can include a multi-zone grid structure that can receive multiple independent voltages to output particle beams with a spatial-dependent irradiance. The outputted spatial-dependent irradiance can provide a substantial uniform radiant exposure on each portion of the target substrate. Further, the particle beam apparatus can be configured to spatially adjust exposure time of the tilted target substrate by moving a shutter while irradiating the tilted target substrate. In addition, the particle beam apparatus can be configured to adjust exposure time of the tilted target substrate by moving a chuck that carries the target substrate while irradiating the tilted target substrate. The tilted substrate with the spatially adjusted exposure time under the particle beams can receive a substantially uniform radiant exposure at each portion of the target substrate. A benefit of the present disclosure, among others, is to equalize the radiant exposure on the target substrate, thus improving the yield and reliability of the particle beam process (e.g., the elongation process) for the IC manufacturing.

In some embodiments, an apparatus can include a chamber and an ion source in the chamber. The ion source can include an outlet. The ion source can be configured to generate a particle beam. The apparatus can further include a grid structure proximate to the outlet of the ion source and configured to manipulate the particle beam. A first portion of the grid structure can be electrically insulated from a second portion of the grid structure.

In some embodiments, a method can include loading a substrate on a chuck, increasing a first separation between a first portion of the substrate and an ion source, decreasing a second separation between a second portion of the substrate and the ion source, and moving a shutter to expose the first portion of the substrate to the ion source while shielding the second portion of the substrate from the ion source.

In some embodiments, a method can include loading a substrate on a chuck, tilting an angle between a normal of the substrate and an outlet of an ion source, and moving the chuck to expose first and second portions of the substrate to the outlet with first and second time durations, respectively.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    loading a substrate on a chuck;
    increasing a first separation between a first portion of the substrate and an ion source;
    decreasing a second separation between a second portion of the substrate and the ion source; and
    moving a shutter with a velocity based on an angle between a normal of the substrate and an outlet of the ion source to expose the first portion of the substrate to the ion source while shielding the second portion of the substrate from the ion source.

2. The method of claim 1, wherein increasing the first separation and decreasing the second separation comprise:
    adjusting an angle between a normal of the chuck and an outlet of the ion source; and
    adjusting a third separation between the chuck and an outlet of the ion source.

3. The method of claim 1, wherein moving the shutter comprises selectively irradiating, via the ion source, the first portion of the substrate over the second portion of the substrate.

4. The method of claim 1, wherein moving the shutter comprises:
    placing, via the chuck, the first and second portions of the substrate under the ion source;
    placing the shutter over the first and second portions of the substrate; and
    moving the shutter to expose the ion source to the first portion of the substrate while the shutter is between the ion source and the second portion of the substrate.

5. The method of claim 1, wherein moving the shutter comprises:
    activating the ion source to generate a particle beam;
    placing the shutter under first and second edge portions of the activated ion source; and
    moving the shutter to expose the substrate to the first edge portion of the activated ion source while the shutter is between the substrate and the second edge portion of the activated ion source.

6. The method of claim 1, wherein moving the shutter comprises:
    placing the first and second portions of the substrate under first and second edge portions of the ion source, respectively; and
    moving the shutter along a horizontal direction, wherein the horizontal direction is a horizontal projection of a direction from the first edge portion of the substrate to the second edge portion of the substrate.

7. The method of claim 1, wherein the ion source comprises two opposite edge portions disposed proximate to first and second portions of a chamber, and wherein exposing the first portion and shielding the second portion comprises moving an edge of the shutter from a space over the first portion of the chamber to an other space over the second portion of the chamber.

8. The method of claim 1, further comprising:
    exposing the second portion of the substrate to the ion source;
    shielding, via the shutter, the first and second portions of the substrate from a plasma source; and
    rotating, via the chuck, the substrate.

9. A method, comprising:
    loading a substrate with first and second portions on a chuck;
    tilting an angle between a normal of the substrate and an outlet of an ion source;
    moving a shutter in first and second directions to expose the first and second portions of the substrate to the ion source for different time periods; and
    rotating the substrate prior to moving the shutter from the first direction to the second direction.

10. The method of claim 9, wherein a first separation between the first portion of the substrate and the outlet is greater than a second separation between the second portion of the substrate and the outlet.

11. The method of claim 9, wherein moving the shutter comprises moving the shutter along a horizontal direction, and wherein the horizontal direction is a horizontal projection of a direction from the second portion of the substrate to the first portion of the substrate.

12. The method of claim 9, wherein moving the shutter comprises:
   moving the shutter in the first direction during a first time period; and
   moving the shutter in the second direction during a second time period, wherein the first and second directions are opposite to each other.

13. The method of claim 9, wherein moving the shutter comprises moving the shutter with a velocity based on the angle between the normal of the substrate and the outlet of the ion source.

14. The method of claim 9, further comprising:
   deactivating the ion source to stop providing a particle beam;
   determining a location of the shutter;
   rotating, via the chuck, the substrate; and
   activating the ion source to irradiate the rotated substrate.

15. A method, comprising:
   loading a substrate with first and second portions on a chuck;
   determining a position of the chuck relative to an outlet of an ion source;
   determining a position of a shutter relative to the outlet of the ion source;
   applying substantially equal bias voltages to first and second portions of a grid structure disposed between the ion source and the shutter; and
   moving the shutter to control exposure of the first and second portions of the substrate to the ion source.

16. The method of claim 15, wherein moving the shutter comprises moving the shutter with a velocity based on an angle between a normal of the substrate and the outlet of the ion source.

17. The method of claim 15, wherein moving the shutter comprises:
   moving the shutter in a first direction during a first time period;
   deactivating the ion source to stop providing a particle beam;
   moving the shutter in a second direction during a second time period, wherein the first and second directions are opposite to each other; and
   activating the ion source to irradiate the substrate.

18. The method of claim 15, wherein moving the shutter comprises:
   moving the shutter in a first direction during a first time period;
   rotating, via the chuck, the substrate; and
   moving the shutter, after rotating the substrate, in a second direction during a second time period, wherein the first and second directions are opposite to each other.

19. The method of claim 15, further comprising exposing the substrate to a particle beam generated from the ion source with a substantially constant irradiance.

20. The method of claim 15, wherein moving the shutter comprises moving the shutter at different velocities at different time periods.

* * * * *

UNITED STATES PATENT AND TRADEMARK OFFICE
CERTIFICATE OF CORRECTION

| | |
|---|---|
| PATENT NO. | : 12,087,558 B2 |
| APPLICATION NO. | : 17/402030 |
| DATED | : September 10, 2024 |
| INVENTOR(S) | : Chang et al. |

Page 1 of 1

It is certified that error appears in the above-identified patent and that said Letters Patent is hereby corrected as shown below:

In the Specification

In Column 5, Line 28, delete "stricture" and insert -- structure --, therefor.

In Column 9, Line 24, delete "208B," and insert -- 208B. --, therefor.

In Column 9, Lines 45-46, delete "y-direction," and insert -- y-direction; --, therefor.

Signed and Sealed this
Third Day of December, 2024

Katherine Kelly Vidal
*Director of the United States Patent and Trademark Office*